United States Patent [19]

Lo

[11] Patent Number: 5,963,929
[45] Date of Patent: *Oct. 5, 1999

[54] RECURSIVE NEURAL FILTERS

[75] Inventor: James Ting-Ho Lo, Howard County, Md.

[73] Assignee: Maryland Technology Corporation, Ellicott City, Md.

[*] Notice: This patent is subject to a terminal disclaimer.

[21] Appl. No.: 08/893,781

[22] Filed: Jul. 11, 1997

Related U.S. Application Data

[63] Continuation-in-part of application No. 08/104,488, Aug. 9, 1993, Pat. No. 5,649,065, which is a continuation-in-part of application No. 08/068,176, May 28, 1993, Pat. No. 5,408,424.

[51] Int. Cl.[6] ...................................................... G06F 15/18
[52] U.S. Cl. ............................................... 706/22; 706/30
[58] Field of Search ................................. 706/22, 30, 16, 706/21, 39

[56] References Cited

U.S. PATENT DOCUMENTS

| | | | |
|---|---|---|---|
| 5,003,490 | 3/1991 | Castelaz et al. | 706/22 |
| 5,150,323 | 9/1992 | Castelaz | 706/22 |
| 5,408,424 | 4/1995 | Lo | 706/22 |
| 5,588,091 | 12/1996 | Alkon et al. | 706/31 |
| 5,649,065 | 7/1997 | Lo et al. | 706/22 |

OTHER PUBLICATIONS

R. S. Bucy and K. D. Senne, "Digital Synthesis of Non–linear Filters," *Automatica*, vol. 7, pp. 287–298 (1971).

J.T.–H. Lo and L. Yu, "Overcoming Recurrent Neural Networks' Compactness Limitation for Neurofiltering," Proceedings of the International Conference on Neural Networks, vol. 4, pp. 2181–2186 (1997).

J. T.–H. Lo, "Optimal Estimation for the Satellite Attitude Using Star Tracker Measurements," *Automatica*, vol. 22, pp. 477–482 (1986).

J. T.–H. Lo and S.–K. Ng, "Optimal Fourirer–Hermite Expansion for Estimation," *Stochastic Processes and their Applications*, vol. 21, pp. 291–304 (1986).

S. I. Sudharsanan and M. K. Sundareshan, "Maximum A posteriori State Estimation: A Neural Processing Algorithm," Procs. of the 28th Conf. on Decision and Control, Tampa, Florida, pp. 1805–1806 (1989).

Q. Sun et al, "A Neural Network Computation Algorithm for Discrete–Time Linear System State Estimation," in *Procs. of IJCNN*, Jun. 1992, Baltimore, Maryland, p. I–443 (1992).

J. L. Elman, "Finding Structure in Time," *Cognitive Science*, vol. 14, pp. 179–211 (1990).

(List continued on next page.)

*Primary Examiner*—Robert W. Downs

[57] ABSTRACT

A recursive neurofilter comprising a recursive neural network (NN) is disclosed for processing an information process to estimate a signal process with respect to an estimation error criterion. The information process either consists of a measurement process, or if the signal and measurement processes are time-variant, consists of the measurement process as well as a time variance process, that describes the time-variant properties of the signal and measurement processes. The recursive neurofilter is synthesized from exemplary realizations of the signal and information processes. No assumptions such as Gaussian distribution, linear dynamics, additive noise, and Markov property are required. The synthesis is performed essentially through training recursive NNs. The training criterion is constructed to reflect the mentioned estimation error criterion with the exemplary realizations. If an estimation error statistics process of a primary recursive neurofilter is needed, an ancillary recursive neurofilter is used to produce an approximate of this estimation error statistics process. An ancillary recursive neurofilter inputs either said primary recursive neurofilter's input process or said primary recursive neurofilter's input and output processes.

14 Claims, 11 Drawing Sheets

OTHER PUBLICATIONS

D. L. Elliott, "A Better Activation Function for Artificial Neural Networks," ISR Technical Report TR 93–8, Institute for Systems Research, University of Maryland, College Park, MD 20742 (1993).

M. I. Jordan, "Attractor Dynamics and Parallelism in a Connectionist Sequential Machine," in Procs. of the 8th Annual Conf. of the Cognitive Science Society, pp. 531–546, Erlbaum (1986).

J. T.–H. Lo, "Finite–dimensional Sensor Orbits and Optimal Nonlinear Filtering," *IEEE Transactions on Information Theory*, vol. IT–18, pp. 583–588 (1972).

K. Hornik et al, "Multilayer Feedforward Networks are Universal Approximators," *Neural Networks*, vol. 2, pp. 359–366 (1989).

P. Poddar and K. P. Unnikrishnan, "Non–linear Prediction of Speech Signals Using Memory Neuron Networks," in *Neural Networks for Signal Processing*, ed. J. H. Juang et al, pp. 395–404 (1991).

A. J. Robinson and F. Fallside, "A Dynamic Connectionist Model for Phoneme Recognition," in *Neural Networks from Models to Applications*, ed. L. Personnaz and G. Dreyfus, pp. 541–550, IDEST, Paris (1989).

O. Nerrand et al, "Neural Network Training Schemes for Non–linear Adaptive Filtering and Modelling," in *Procs. of IJCNN*, Jun. 1991, Seattle, Washington, pp. I–61—66 (1991).

J. P. DeCruyenaere and H. M. Hafez, "A Comparison between Kalman Filters and Recurrent Neural Networks," in *Procs. of IJCNN*, Jun. 1992, Baltimore, Maryland, pp. IV–247—251 (1992).

J. T.–H. Lo, "Optimal Filtering by Recurrent Neural Networks," in Procs. of the 30th Annual Allerton Conf. on Comm., Contr., and Comput., Monticello, IL, Oct.1992, ed. P. Van Dooren and M. Spong, pp. 903–912 (1992).

J. T.–H. Lo, "Synthetic Approach to Optimal Filtering," Procs. of the 1992 Intl. Simul. Tech. Conf. and 1992 Workshop on Neural Networks, Clear Lake, Texas, Nov. 1992, pp. 475–481 (1992).

O. Nerrand et al, "Neural Networks and Nonlinear Adaptive Filtering: Unifying Concepts and New Algorithms," *Neural Computation*, vol. 5, pp. 165–199 (1993).

L. Yin et al, "A New Class of Nonlinear Filters—Neural Filters," *IEEE Transaction on Signal Processing*, vol. 41, pp. 1201–1222 (1993).

R.J. Williams, "Training Recurrent Networks Using the Extended Kalman Filter," Int'l. Joint Conf. on Neural Networks, vol. 4, pp. 241–246, Jun. 1992.

R.J. Williams and D. Zipser, "A Learning Algorithm for Continually Running Fully REcurrent Neural Networks," Neural Computation, vol. 1, pp. 270–280, Dec. 1989.

M.B. Matthews and G.S. Moschytz, "Neural–network non-linear adaptive filtering using the extended Kalman filter algorithm," Proc. of the Int'l Neural Network Conference, vol. 1, pp. 115–119, Jul. 1990.

Ashouri et al, "Neural Networks with nonlinear weights for pattern classification", IEEE 1989.

RECURSIVE NEURAL FILTERS

CROSS-REFERENCE TO RELATED APPLICATIONS

This application is a continuation-in-part of appliction Ser. No. 08/104,488 filed Aug. 9, 1993, U.S. Pat. No. 5,649,065 which is a continuation-in-part of application Ser. No. 08/068,176 filed May 28, 1993, U.S. Pat. No. 5,408,424.

STATEMENT OF GOVERMENT INTEREST

This invention was made in part with United States Government support under contract F30602-91-C-0033 awarded by the U.S. Air Force. The Government has certain rights in some claims of this invention.

BACKGROUND OF THE INVENTION

This invention is concerned with the problem of discrete-time optimal filtering, namely the problem of processing a discrete-time measurement process to estimate a discrete-time signal process.

In the standard formulation of the problem in the modern theory of optimal filtering, the signal process and measurement process are described by the mathematical/statistical model:

$$x(t+1)=f(x(t),t)+G(x(t),t)\xi(t), x(1)=x_1, \quad (1)$$

$$y(t)=h(x(t),t)+\epsilon(t), \quad (2)$$

where $x(t)$ is an n-dimensional stochastic process; $y(t)$ is an m-dimensional stochastic process; $x_1$ is a Gaussian random vector, $\xi(t)$ and $\epsilon(t)$ are respectively $n_1$-dimensional and $m_1$-dimensional Gaussian noise processes with zero means; $x_1$, $\xi(t)$ and $\epsilon(t)$ have given joint probability distributions; and $f(x,t)$, $G(x,t)$ and $h(x,t)$ are known functions with such appropriate dimensions and properties that (1) and (2) describe faithfully the evolutions of the signal and measurement. The problem of discrete-time optimal filtering is to design and make a discrete-time dynamic system that inputs $y(t)$ and outputs an estimate $\hat{x}(t)$ of $x(t)$ at each time $t=1, 2, \ldots, T$, which estimate minimizes a given estimation error criterion. Here T is a positive integer or infinity. The dynamic system is called an optimal filter with respect to the given estimation error criterion. The dynamic state of the optimal filter at a time $t_1$ must carry the optimal conditional statistics given all the measurements $y(t)$ that have been received up to and including the time $t_1$ at the time so that at the next time $t_1+1$, the optimal filter will receive and process $y(t_1+1)$ using the optimal conditional statistics from $t^1$, and then produce the optimal estimate $\hat{x}(t_1+1)$. The most widely used estimation error criterion is the mean square error criterion, $E[\|x(t)-\hat{x}(t)\|^2]$, where E and $\|\cdot\|$ denote the expectation and the Euclidean norm respectively. The estimate $\hat{x}(t)$ that minimizes this criterion is called the minimum variance estimate or the least-square estimate.

The most commonly used method of treating such a problem is the use of a Kalman filter (KF) or an extended Kalman filter (EKF). A detailed description of the KF and EKF (and some other approximate nonlinear filters) can be found in e.g., A. H. Jazwinski, *Stochastic Processes and Filtering Theory*, pp. 194–358, Academic Press (1970), and B. D. O. Anderson and J. B. Moore, *Optimal Filtering*, pp. 36–287, Prentice-Hall (1979). The KF and EKF have been applied to a wide range of areas including aircraft/ship inertial and aided-inertial navigation, spacecraft orbit determination, satellite attitude estimation, phase array radar tracking, nuclear power plant failure detection, power station control, oceanographic surveying, biomedical engineering, and process control. Many important papers on the application of the KF and EKF can be found in H. W. Sorenson, editor, *Kalman Filtering: Theory and Application*, IEEE Press (1985).

In the rare cases where f and h are linear functions of $x(t)$ and G does not depend on $x(t)$, the model, (1) and (2), is called the linear-Gaussian model. If the KF is used for a linear-Gaussian model, the resulting estimate $\hat{x}(t)$ is the minimum variance (or the least-squares) estimate. In most cases, however, the foregoing linearity conditions on f, h and G are not satisfied and the EKF is used. At each time point, the EKF, which is a suboptimal approximate filter, first linearizes f and C at the estimated value of $x(t)$ and linearizes h at the predicted value of $x(t+1)$. Then the EKF uses the KF equations to update the estimated value of $x(t+1)$ and the predicted value of $x(t+2)$ for the new measurement $y(t+1)$. By iterating the linearization and estimation a certain number of times or until convergence at each time point, we have the so-called iterated EKF (IEKF). Since both the EKF and IEKF involve linearization, they are not optimal filters. In fact, when either the random driving term $G(x(t))\xi(t)$ in (1) or the random measurement noise $\epsilon(t)$ in (2) has such large variances and covariances that the aforementioned estimated value and predicted value of the signal are not very close to the true signal, and/or when the functions f, G and h are not very smooth, the linearization may be a poor approximation and the EKF as well as IEKF may yield poor estimates or even fail totally.

This shortcoming of the EKF and IEKF has motivated an enormous amount of work on nonlinear filtering by the analytic approach for over thirty years. But the results by the analytic approach have been disappointing. With very few, if any, exceptions, the analytic results on nonlinear filtering have been confined to research papers and textbooks. The EKF and, to a much less extent, the IEKF remain as the standard filters for estimating stochastic signals in practice.

Starting with a mathematical/statistical model, the analytic approach searches for a solution consisting of analytic formulas and/or equations that describe the structures and determine the parameters of the filter. In the process of searching, deductive reasoning is used and many assumptions are made to make some special cases analytically tractable. In fact, the KF was derived under the assumptions that f and h are linear in $x(t)$, C does not depend on $x(t)$, and $\xi(t)$ and $\epsilon(t)$ are Gaussian sequences. The model, (1) and (2), contains such assumptions as the Markov property, Gaussian distribution, and additive measurement noise. When enough additional assumptions are made to derive explicit filter equations, these assumptions are usually so restrictive and/or unrealistic that they prevent the filter equations from much real-world application.

When not enough additional assumptions are made, the analysis involved is so deep and complicated that it leads mostly to mathematical formulas and equations that are not ready for designing or implementing a real filter. This state of the art is reflected in V. Krishnan, *Nonlinear Filtering and Smoothing: An Introduction to Martingales, Stochastic Integrals and Estimation*, John Wiley & Sons (1984) and R. S. Liptser and A. N. Shiryayev, *Statistics of Random Processes I: General Theory and II: Applications*, Springer-Verlag (1977). In the few cases where the assumptions are not so bad and the explicit filtering algorithms are available, these filtering algorithms involve such an enormous amount of computation that their real-time implementation is prohibitively expensive if not impossible. Some examples of such cases can be found in R. S. Bucy and K. D. Senne, "Digital Synthesis of Non-linear Filters," *Automatica*, Vol. 7, pp. 287–298, 1971, J. T.-H. Lo, "Optimal Estimation for the Satellite Attitude using Star Tracker Measurements," *Automatica*, Vol. 22, pp. 477–482, 1986, and J. T.-H. Lo and S. K. Ng, "Optimal Fourier-Hermite Expansion for Estimation," *Stochastic Processes and Their Applications*, Vol. 21, No. 2, pp. 21–35, 1987.

Because of the inherent inaccuracies and frequent failures of the EKF and IEKF and the restrictive and unrealistic assumptions and prohibitive computational requirements of other existing filters, new filters are needed that consistently yield a high degree of estimation accuracy vis-a-vis the information contained in the measurements about the signal, and that can be applied in a large variety of real-world situations.

Recent years have seen a rapid growth in the development of artificial neural networks (ANNs), which are also known as connectionist models, parallel distributed processors, neuroprocessors, and neurocomputers. Being crude mathematical models of theorized mind and brain activity, ANNs exploit the massively parallel processing and distributed information representation properties that are believed to exist in a brain. A good introduction to ANNs can be found in R. Hecht-Nielsen, *Neurocomputing*, Addison-Wesley (1990) and J. Hertz, A. Krogh and R. G. Palmer, *Introduction to the Theory of Neural Computation*, Addison-Wesley (1991).

There is a large number of ANN paradigms such as Hopfield networks, high-order networks, counterpropagation networks, bidirectional associative memories, piecewise linear machines, neocognitrons, self-organizing feature maps, adaptive resonance theory networks, Boltzmann machines, multilayer perceptrons (MLPs), MLPs with various feedback structures, other recurrent neural network paradigms, etc. These and other ANN paradigms have been applied to systems control (e.g., D. A. White and D. A. Sofge, editors, *Handbook of Intelligent Control*, Van Nostrand Reinhold (1992)), signal processing (e.g., B. Kosko, editor, *Neural Networks for Signal Processing*, Prentice Hall (1992)), Speech Processing (e.g., D. P. Morgan and C. L. Scofield, *Neural Networks and Speech Processing*, Kluwer Academic Publishers (1991)), and others (e.g., E. Sanchez-Sinencio and C. Lau, editors, *Artificial Neural Networks*, IEEE Press (1992)).

There are many research articles concerning applications of ANNs, most of which can be found in the foregoing books, journals (e.g., *IEEE Transactions on Neural Networks*, *Neural Networks*, and *Neural Computation*), and Conference proceedings (e.g., *Proceedings of the International Joint Conference on Neural Networks*). Application of one of the aforementioned neural network paradigms to optimal filtering was reported in S. I. Sudharsanan and M. K. Sundareshan, "Maximum A Posteriori State Estimation: A Neural Processing Algorithm," *Proceedings of the 28th Conference on Decision and Control*, pp.1805–1806 (1989). The signal and measurement processes considered therein are described by the linear-Gaussian model and the neural network used is a Hopfield network with the neural activation function slightly modified. The connection weights and neuron biases for the network are determined by using the Kalman filter (KF) equations so that when the Hopfield network stabilizes at each time point, the stable state is the minimum variance estimate. The usefulness of the method is very limited, because it can only be applied to the linear-Gaussian model for which the KF equations are available and the weights and biases of the Hopfield network need to be updated in the operation of the Hopfield network by other means using the Kalman filter equations.

There are also many patent documents concerning the applications of ANNs. Only a couple that seem more relevant to the present invention among them are mentioned as follows. In U.S. Pat. No. 5,003,490 to P. F. Castelaz and D. E. Mills, (1991), a multilayer perceptron with a sigmoid activation function and a tapped delay line for the input is used to classify input waveforms. In U.S. Pat. No. 5,150,323 (1992) to P. F. Castelaz, a multilayer perceptron with a sigmoid activation function and a couple of tapped delay lines for preprocessed inputs is used for in-band separation of a composite signal into its constituent signals.

In 1992, a series of research papers on a synthetic approach to optimal filtering were presented in national and international conferences. Much of the results were reported in James Ting-Ho Lo, "Synthetic Approach to Optimal Filtering," *IEEE Transactions to Neural Networks*, Vol. 5, No. 5, pp. 803–811, September 1994. These results and extensions were included in U.S. Pat. No. 5,408,424 (1995) to James Ting-Ho Lo, of which the present invention is a continuation in part.

SUMMARY OF INVENTION

A recursive neurofilter is disclosed for processing an information process to estimate a signal process. The information process consists of a measurement process, or if the measurement and signal processes are time-variant, consists of not only the measurment process but also a time variance process that describes the time variant properties of the measurement and signal processes. The disclosed recursive neurofilter is a recursive neural network (NN), resulting from synthesizing realizations of the signal process and information process. The synthesized recursive neurofilter can approximate a theoretical optimal filter in performance to any preselected degree of accuracy, provided there are sufficient numbers of neurons and connections in the recursive neurofilter of a proper paradigm. The recursive neurofilter, whose dynamic state carries conditional statistics, is nearly optimal for its neural network architecture. Moreover, the parallel architecture of the recursive neurofilter makes it suitable for real-time filtering.

The synthesis is performed through training at least one recursive NN and selecting one in consideration of the filtering performance versus the numbers of neurons and connections in the recursive NN to optimize the cost-effectiveness. In training an recursive NN, the adjustable weights (e.g. connection weights, neuron parameters and/or initial dynamic state of the recursive NN) are determined essentially by minimizing or reducing a training criterion by the variation of them. Incorporating the training data, the training criterion is a function of these adjustable weights of the recursive NN under training. The training criterion is defined to reflect an estimation error criterion suitable for the filtering needs and environment.

Training data consist of realizations of the signal and information processes. If a mathematical model of the signal and information processes such as (1) and (2) is available, realizations of these processes are generated by computer simulation. Otherwise, training data can be collected in actual experiments and/or past operations with the these processes. Since we do not use a mathematical model of the signal and information processes to derive formulas and equations for the recursive neurofilter, such properties as the Markov property, Gaussian distribution and additive noise are not required of the signal and information processes for the present invention to apply.

Numerical work was carried out to compare the recursive neurofilters and the conventional KF, EKF and IEKF for signal and measurement processes that can be described by the mathematical model (1) and (2). The numerical results show that the recursive neurofilters almost equal the KF in performance for a linear model in both transient and steady states of filtering, and always outperform the EKF and IEKF for a nonlinear model, when there is sufficient number of neurons (or processing elements) in the recursive neurofilter.

If an estimation error statistics process is wanted of a primary recursive neurofilter, an ancillary recursive neurofilter is used to evaluate the estimation error statistics process. An ancillary recursive neurofilter inputs either said primary recursive neurofilter's input process or said primary recursive neurofilter's input and output processes.

DESCRIPTION OF THE DRAWINGS

These and other features, aspects and advantages of the present invention will become better understood with regard to the following description, appended claims, and accompanying drawings where:

DESCRIPTION OF PREFERRED EMBODIMENTS

Figure 1:
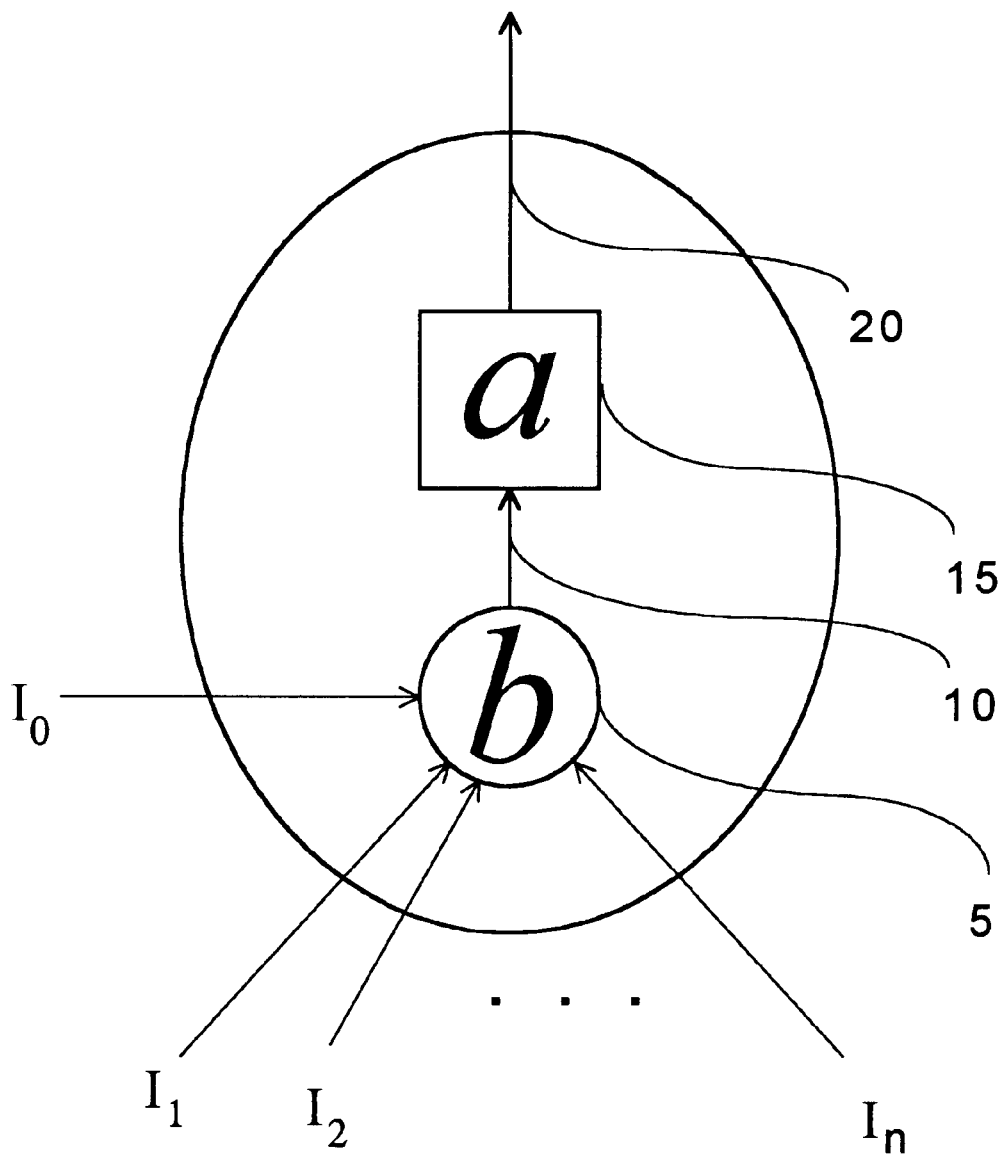
FIG. 1 is a schematic diagram of a typical neuron, which consists of a basis function b and an activation function a, forming a function composition. The basis function 5 is usually a finite series expansion of the bias $I_0$ and inputs, $I_1$, ..., $I_n$, to the neuron, which expansion is comprised of polynomial, rational, trigonometric, exponential, logarithmic, hyperbolic, transcendental, wavelet, and/or spline element(s). The value of the basic function at the link 10 is $b(I_0, I_1, \ldots, I_n)$. The activation function 15 is simply a linear or nonlinear transformation, which is a sigmoidal, exponential, wavelet, spline, polynomial, rational, trigonometric, hyperbolic, logarithmic, other transcendental function or a combination thereof The activation level 20 of the neuron is thus $a(b(I_0, I_1, \ldots, I_n))$.

In accordance with the present invention, a new apparatus is provided for processing a discrete-time information process for the purpose of estimating a discrete-time signal process. Some terminologies used herein are now defined: A vector is an element of a finite dimensional Euclidean space. A scalar is a one dimensional vector. A vector-valued variable is either a single-dimensional or a multiple-dimensional variable. A process is an ordered sequence of vector-valued variables with the same dimension. If the vector-valued variables in a process are random variables, the process is a stochastic process. The sequence index is called time and denoted by t and takes on integer values. There may or may not be a mathematical/statistical model for a process, which governs the evolution of the process. There may or may not be any knowledge about the relationship among the components of each vector-valued variable of a process or among the vector-valued variables at different times.

A collection of all the stochastic processes whose values at a plurality of times are what we want to estimate is called a signal process, only if the random variables in these stochastic processes at a time t cannot be expressed as a (deterministic) function of the random variables in the same stochastic processes at the preceding time t−1. The vector value of a signal process at time t is called the signal or signal vector at time t. An example mathematical/statistical model for a signal process is (1) with $G(x(t),t)\xi(t)\neq 0$ at any time t. The collection of all the additional processes whose values at a plurality of times need to be estimated to evaluate estimation error statistics wanted of estimating the signal process is called an ancillary signal process. The time sequence of these estimation error statistics wanted is called an estimation error statistics process. The collection of all the processes that are not a time-shifted (e.g. time-delayed) copy of the signal process, and whose values at each time are functions of the signal process and usually some noises/interferences, are available to and selected by us for the estimation of a signal process, is called a measurement process. The vector value of a measurement process at time t is called the measurements or measurement vector at time t. The measurements at a time are usually sensor outputs at the time. An example mathematical/statistical model for a measurement process is (2). A measurement process may or may not contain random noises, but must contain information about the signal process. It is noted that while the signal process is defined independently of the measurement process, the measurement process cannot be defined independently of the signal process. Our definitions of the signal and measurement processes are in consistency with the ordinary usage of the word "measurement." A signal vector and a measurement vector can be either single-dimensional or multiple-dimensional.

A process can be classified as a time-variant process or a time-invariant process. A time-invariant process is a process whose behavior or evolution given the same initial value is invariant under a shift of time. For instance, if the functions, f(x,t) and G(x,t), that appear in the model, (1), are functions of their first argument x only and do not depend on their second argument t, and if the covariance $E[\xi(t)\xi^T(t)]$ of the Gaussian noise process $\xi(t)$, in the same model is a nonzero constant matrix, then a signal process described by the model is a time-invariant signal process. In addition, if the function, h(x,t), that appears in (2) is also a function of its first argument x only and does not depend on its second argument t, and if the covariance $E[\epsilon(t)\epsilon^T(t)]$ of the Gaussian noise process $\epsilon(t)$ is a constant matrix, then a measurement process described by (2) is a time-invariant measurement process.

If the signal and measurement processes are jointly time-invariant, they are called time-invariant signal and measurement processes. Otherwise, they are called time-variant signal and measurement processes. All or some of the time-variant properties of the time-variant signal and measurement processes are usually described by a vector-valued time function. Two examples follow.

Example 1. Consider the scalar signal and scalar measurement processes described by the equations, $$x(t+1)=f(t)x(t)+g(t)\xi(t), x(1)=x_1, \quad (3)$$

$$y(t)=h(t)x^3(t)+\epsilon(t), \quad (4)$$

where f(t), g(t) and h(t) are known scalar-valued functions of time; the variances of the zero-mean Gaussian noise processes, $\xi(t)$ and $\epsilon(t)$, are $E[\xi^2(t)]=q(t)$ and $E[\epsilon^2(t)]=r(t)$, which are also known functions of time; $x_1$ is a zero-mean Gaussian random variable with variance 1; and $x_1$, $\xi(t)$ and $\epsilon(t)$ are statistically independent. The time function (f(t), g(t), h(t), q(t), r(t)) describes the time-variant properties of the time-variant signal and measurement processes.

Example 2. Consider the n-dimensional signal and m-dimensional measurement processes described by the equations, $$x(t+1)=f(x(t),u(t))+G(x(t),u(t))\xi(t), x(1)=x_1, \quad (5)$$

$$y(t)=h(x(t),u(t))+\epsilon(t), \quad (6)$$

where u(t) is a p-dimensional function of time; $x_1$ is a Gaussian random vector with mean zero and covariance $E[x_1 x_1^T]=p_1$; $\xi(t)$ and $\epsilon(t)$ are respectively $n_1$-dimensional and $m_1$-dimensional Gaussian noise processes with zero means and covariance $E[\xi(t)\xi^T(t)]=Q$ and $E[\epsilon(t)\epsilon^T(t)]=R$; $x_1$, $\xi(t)$ and $\epsilon(t)$ are statistically independent; the functions f(x,u), G(x,u), and h(x,u) are known functions with such appropriate dimensions and properties that the above equations describe the signal and measurement processes faithfully. In fact, the above equations describe a rather general control system with x(t), y(t) and u(t) as the state, observation and control respectively. The control function u(t) is the time function describing the time-variant properties of the above signal and measurement processes.

The time function describing the time-variant properties of the signal and measurement processes for a recursive filter under design may change from operation to operation of the recursive filter. Therefore, the time function is a process, an ordered sequence of variables, which is called the time variance process. The variable at time t of the time variance process is called the time variance vector at time t.

An information process is a process that consists of the measurment process, or a process that consists of not only the measurment process but also a time variance process, which describes the time-variant properties of the signal and measurement processes. The vector-valued variable of an information process at time t is called the information vector at time t.

A realization of a signal process and the corresponding realization of a information process are, respectively, a sequence of the consecutive vector values of the signal process and a sequence of the corresponding consecutive vector values of the information process. Given the signal and information processes for a recursive neuofilter under design, a realization of the signal process and the corresponding realization of the information process are called a realization of the operating environment of the recursive neurofilter, which is denoted by ω.

A recursive filter is a dynamic system, with a dynamic state, that inputs the information vectors one at a time in the order that they appear in the information process and then outputs, at each corresponding time, an estimate (or estimate vector) of the vector-valued variable of a signal process or an ancillary signal process at the same time. The sequence of outputs from a recursive filter is called the output process of the recursive filter. The sequence of inputs to a recursive filter is called the input process of the recursive filter. The recursive filter is assumed to be a causal dynamic system and hence the estimate produced by the recursive filter at each time $t_1$ is necessarily a function of all the information vectors that have been received by the recursive filter up to and including time $t_1$. The word "recursive filter" is used to refer to either a mathematical description or its implementation of the dynamic system, depending on the context. Recursive filters for estimating the signal process and the ancillary signal process are called a primary recursive filter and an ancillary recursive filter respectively. A measure of the estimation performance of a recursive filter is called an estimation error criterion. Depending on whether an estimation error criterion is for a primary or ancillary recursive filter, the estimation error criterion is called a primary or ancillary estimation error criterion respectively.

Neural Networks and Their Elements and Structures

A neuron or node is a processing element that receives input numbers and produces an output number, which is called the activation level of the neuron or node. Referring to FIG. 1, a typical neuron (or node) consists of two functions, a basis function, b, and an activation function, a, forming a function composition. The basis function 5 is usually a finite series expansion of the bias $I_0$ and inputs, $I_1$, ..., $I_n$, to the neuron, which expansion is comprised of polynomial, rational, trigonometric, exponential, logarithmic, hyperbolic, transcendental, wavelet, and/or spline element(s). The value of the basic function at the link 10 is $b(I_0, I_1, \ldots, I_n)$. The activation function 15 is simply a linear or nonlinear transformation, which is a sigmoidal, exponential, wavelet, spline, polynomial, rational, trigonometric, hyperbolic, logarithmic, other transcendental function or a combination thereof. The activation level 20 of the neuron is thus $a(b(I_0, I_1, \ldots, I_n))$. If the activation level, $a(b(I_0, I_1, \ldots, I_n))$, of a neuron is a nonlinear function of $I_0$, $I_1, \ldots, I_n$, the neuron is called a nonlinear neuron.

Figure 2:
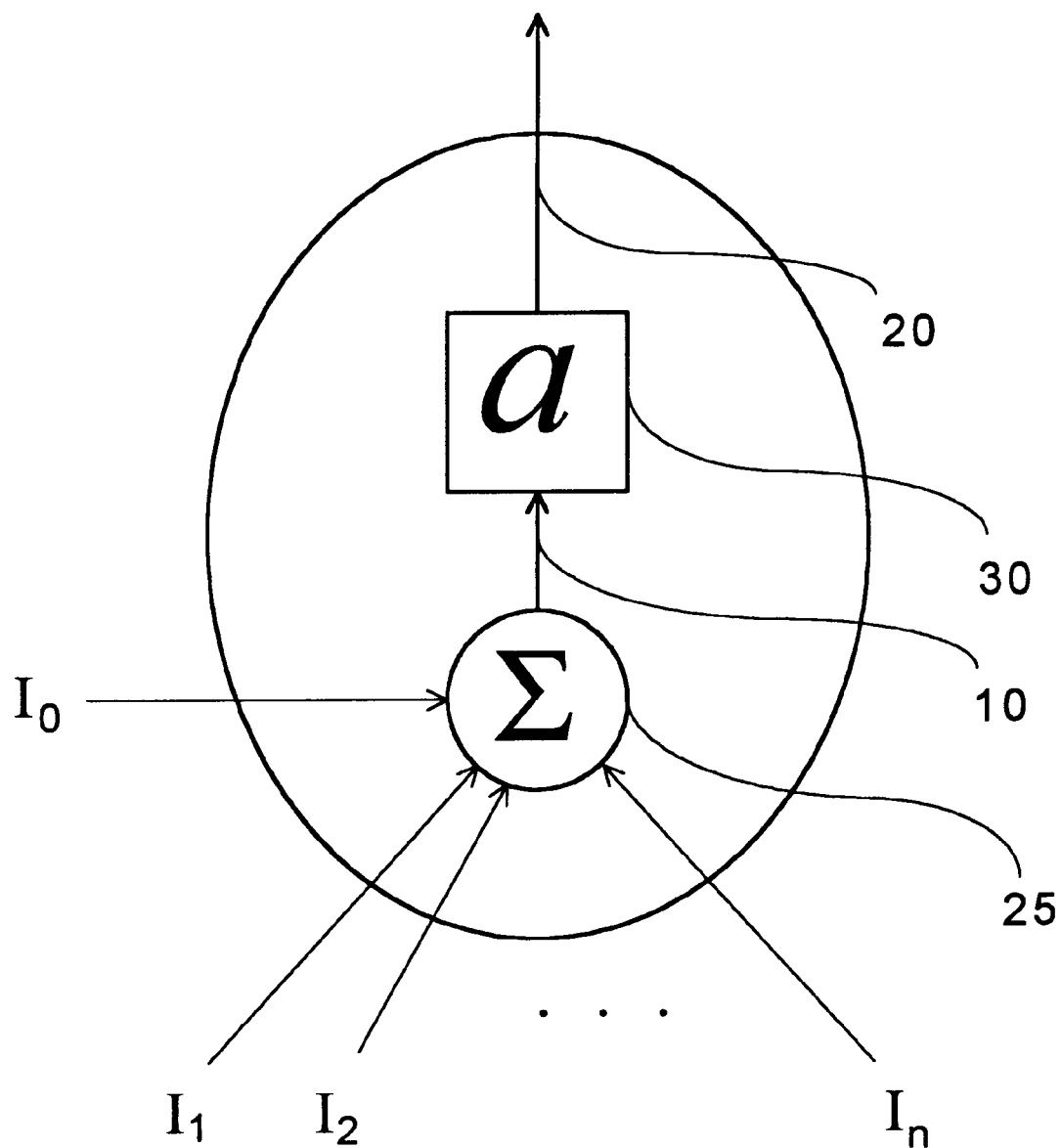
FIG. 2 is a schematic diagram of a widely-used neuron, which is a special case of the typical neuron depicted in FIG. 1. It consists of a summer 25 and an activation function 30 denoted by $\Sigma$ and a respectively. The activation function is a sigmoid function such as the hyperbolic tangent function tanh x, and the logistic function, $1/(1+e^{-x})$. Denoting the inputs to the neuron by $I_1, I_2, \ldots, I_n$, and the bias for the neuron by $I_0$, the basic function here is $\Sigma_{i=0}^n I_i$ and the activation level of the neuron at its output terminal 20 is $a(\Sigma_{i=0}^n I_i)$.

A widely-used neuron, which is a special case of the above typical neuron, is depicted in FIG. 2. It consists of a summer 25 and an activation function 30 denoted by Σ and a respectively. The activation function is a sigmoid function such as the hyperbolic tangent function, tanh x, and the logistic function, $1/(1+e^{-x})$. Denoting the inputs to the typical neuron by $I_1, I_2, \ldots, I_n$, and the bias for the neuron by $I_0$, the basic function here is $\Sigma_{i=0}^{n} I_i$ and the activation level of the neuron at its output terminal 20 is $a(\Sigma_{i=0}^{n} I_i)$.

A constant that affects a neuron's processing such as a constant in the basic and activation functions of the neuron is called a parameter or a weight of the neuron. A delayless connection is means for effecting a weighted signal transfer from one neuron to another neuron. More specifically, a delayless connection is means for multiplying the activation level of a neuron by a number, which is called the weight of the delayless connection, and sending the resulting product to another neuron as one input of this neuron. A weight of a delayless connection is sometimes called a delayless weight. A delay connection is means for multiplying a first neuron's activation level by a number, which is called the weight of the delay connection, holding the resulting product for at least one unit of time, and then sending this product to a second neuron as one input of this second neuron. The second neuron may or may not be the same as the first. A weight of a delay connection is sometimes called a delay weight. By a connection and a weight of a connection, we mean a delayless or delay connection and a weight of a delayless or delay connection, respectively, unless indicated or implied otherwise. The bias for a neuron is a parameter of the neuron, but often treated as the weight of a delayless connection leading into this neuron from a constant activation level 1. A (delayless and/or delay) weight may be set equal to one or some other constant. It may also be determined in a process or procedure called training to be elaborated on later. A weight of a neuron and a weight of a connection leading to said neuron are said to be local to said neuron. It is understood that the word "time" herein refers to the index of a sequence, which may be an index of time or may simply be the numbering or index of patterns or events. In the latter case, the phrases, "a time unit" and "a time step" mean "a change of the numbering or index by one."

A neural network (NN) is a plurality of neurons and a plurality of connections (delay and/or delayless connections), which include one or more neurons receiving input signals from outside the NN (neural network), which neuron(s) are called input neurons and one or more neurons sending out output signals to outside the NN, which neuron (s) are called output neurons. An input signal from outside the NN is referred to as an input of the NN. Those neurons that are neither input neurons nor output neurons are called hidden neurons of the NN. A nonlinear neuron that is neither an input neuron nor an output neuron is called a hidden nonlinear neuron. (It is understood that if a neuron in an NN is treated as a hidden neuron in the training of the NN, examining the activation level of a hidden neuron or using it for a purpose other than the purpose that the NN is trained for in an operation of the NN do not make the hidden neuron an output neuron.) There may be one or more different types of neuron in an NN. For instance, an input neuron may only serve to distribute its single exogenous input signal through connections to some other neuron(s) and an output neuron may only serve to evaluate the sum of its bias and input signals, which arrive through connections from other neurons.

Consider an NN whose N neurons each have a summer and an activation function. Let the neurons in the NN be numbered 1 through N; the activation function of neuron n be denoted by $a_n$; the set of neurons each having a connection leading to neuron n with a delay of m time units be denoted by $D_m(n)$; the weight of the connection from neuron j to neuron i be denoted by $w_{ij}$; the activation level of neuron n at time t be denoted by $\beta_n(t)$; the exogenous input to neuron n be denoted by $I_n$; the bias for neuron n be denoted by $w_{n0}$; and the maximum connection delay be denoted by M. Then at time t, the processing performed by neuron n is $$\eta_n(t) = I_n + w_{n0} + \sum_{m=0}^{M} \sum_{j \in D_m(n)} w_{nj}\beta_j(t-m),$$

$$\beta_n(t) = a(\eta_n(t)).$$

Figure 3:
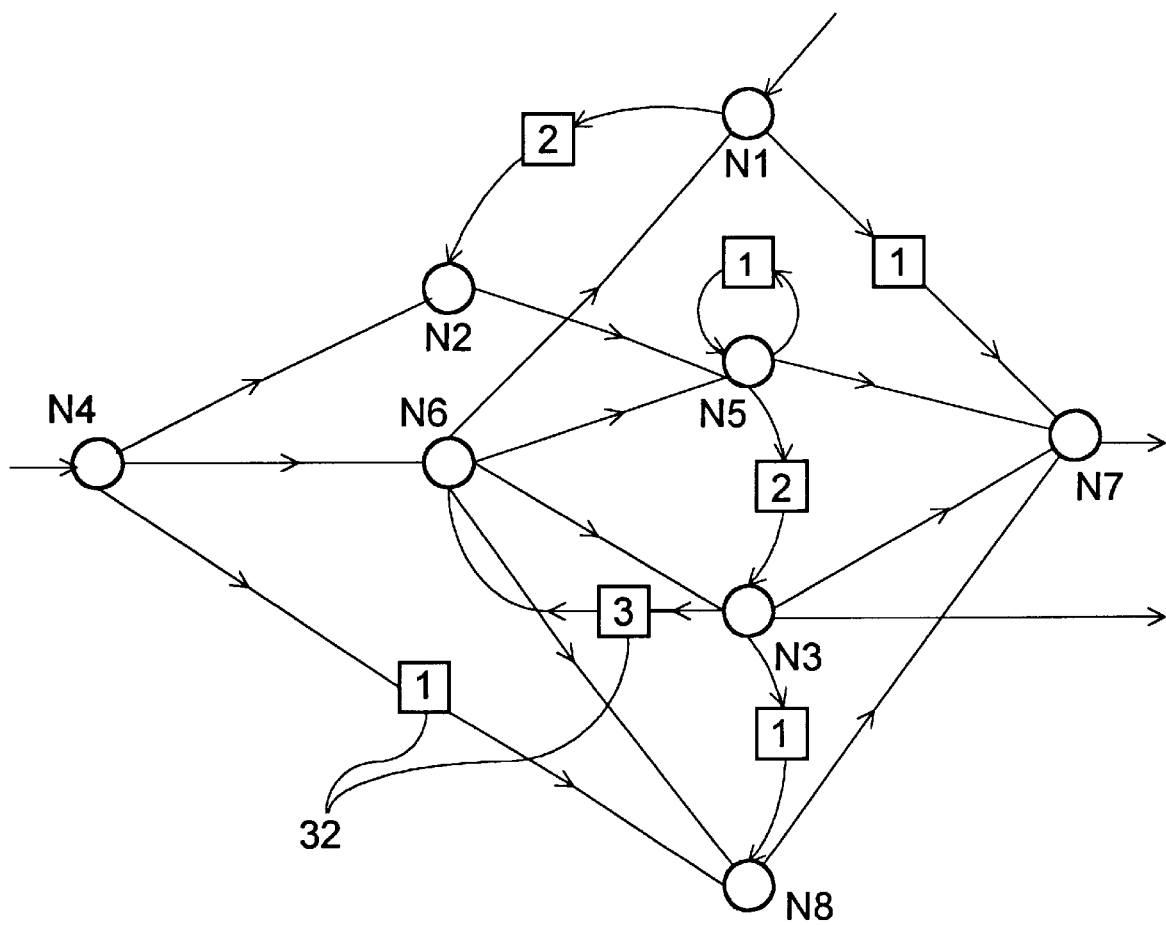
FIG. 3 shows an example neural network (NN). It contains 8 neurons, which are numbered N1 through N8 and represented by circles in the figure. Neurons N1 and N4 are the input neurons receiving exogenous inputs. Neurons N3 and N7 are the output neurons sending out output signals to outside the NN. Both the basic and activation functions of Neuron N4 are the identity function whose input and output are identical. Neuron 4 simply distributes its single input signal to its succeeding neurons N2, N6 and N8. Neuron N7 is simply a summer, which sums the activation levels of N7's preceding neurons N1, N5, N3 and N8. Neurons N1, N2, N3, N5, N6 and N8 are of the same type, whose basic function is a summer and whose activation function is the hyperbolic tangent function, tanh x. A delayless connection is represented by a line with an arrowhead indicating the direction of the signal transfer. A delay connection is represented by two lines with arrowheads connected in series with a box 32 in between. The box encloses a number that indicates the number of time steps that the connection holds a signal before it transfers the signal.

An example NN is shown in FIG. 3. It contains 8 neurons, which are numbered N1 through N8 and represented by circles in the figure. Neurons N1 and N4 are the input neurons receiving exogenous inputs. Neurons N3 and N7 are the output neurons sending out output signals to outside the NN. Both the basic and activation functions of Neuron N4 are the identity function whose input and output are identical. Neuron N4 simply distributes its single input signal to its succeeding neurons N2, N6 and N8. Neuron N7 is simply a summer, which sums the activation levels of N7's preceding neurons N1, N5, N3 and N8. Neurons N1, N2, N3, N5, N6 and N8 are of the same type, whose basic function is a summer and whose activation function is the hyperbolic tangent function, tanh w. A delayless connection is represented by a line with an arrowhead indicating the direction of the signal transfer. A delay connection is represented by two lines, each with an arrowhead, connected in series with a box 32 in between. The box encloses a number that indicates the number of time steps that the connection holds a signal before it transfers the signal.

The example NN has a layer structure: We observe that at a discrete time, neuron N4's activation level must be available, before all the processings in neurons N2 and N6 can be performed. Although N2 and N6 receive signals from N1 and N3 respectively, these signals are delayed signals and are thus available from preceding discrete times. Therefore, as soon as the activation level of N4 becomes available, N2 and N6 can perform their processings and make their activation levels available for other neurons. Similarly, as soon as the activation levels of N2 and N6 become available, the processings of neurons N1, N5, N3 and N8 can be performed, whose activation levels are needed in neuron N7's processing. Hence, the 4 sets of neurons, {N4}, {N2, N6}, {N1, N5, N3, N8}, and {N7}, form 4 layers to be called layer 0, layer 1, layer 2, and layer 3, respectively, of the example NN.

This observation can be easily generalized: Given an NN, we ignore the delay connections and examine the order in which the neurons' processings (7) can take place. Those neuron(s) whose processing(s) can be performed simultaneously form a layer. The resulting layers are then numbered layer 0, layer 1, . . . , in their processing order. Notice that a delayless connection must feed forward from a layer to a higher-ordered layer, but a delay connection may either feed forward to a higher-numbered layer or feed back to the same or a lower-numbered layer. A connection is called a feed-forward connection or a feedback connection, depending on whether it feeds forward or backward.

Recall from the graph theory that a directed graph G consists of two sets, V and E, V being a finite nonempty set of vertices and E being a set of directed pairs of vertices called edges. An edge is represented by a directed pair $(V_i, V_j)$, where $V_i$ is the tail and $V_j$ is the head of the edge. A path from vertex $V_p$ to vertex $V_q$ in graph G is a sequence of vertices, $V_p, V_{i_1}, V_{i_2}, \ldots, V_{i_n}, V_q$, such that $(V_p, V_{i_1})$, $(V_{i_1}, V_{i_2}), \ldots,$ and $(V_{i_n}, V_q)$ are edges in E. A simple path is a path in which all vertices except possibly the first and last are distinct. A cycle is a simple path in which the first and last vertices are the same. A very special case of a cycle is a vertex $V_p$, if $(V_p, V_p)$ is an edge in E. The terminology of directed graphs used here can be found in the book by E. Horowitz and S. Sahni, *Fundamentals of Data Structure*, Computer Science Press, Inc. (1976).

Ignoring the exogenous inputs and the connection delays of an NN, the NN can be viewed as a directed graph with the neurons as the vertices and the (delay and/or delayless) connections as the edges. A neuron on a cycle is called a cyclic neuron. A neuron that is not a cyclic neuron is called a noncyclic neuron. All the neuron(s) and connection(s) that have a path to a cyclic neuron form the recursive section of the NN. The rest form the nonrecursive section. Expressing the NN's output(s) as a function of the inputs, the delayed activation levels (held by the delay connections), and the (connection and neuron) weights of the NN, a weight from the nonrecursive section that appears linearly is called a linear weight and a connection with a linear weight is called a linear connection. A weight or connection that is not linear is called a nonlinear weight or connection, respectively. The set of all the linear connection(s), the neuron(s) at the tail(s) of these linear connection(s), and the linear weight(s) of neuron(s) with a linear weight is called the linear section of the NN. The rest of the NN is called the nonlinear section of the NN. The intersection of the nonlinear section and the nonrecursive section is called the nonlinear subsection of the nonrecursive section of the NN.

In the example NN shown in FIG. 3, there are two cycles. One cycle is the sequence, N5, N3, N6 and N5, because (N5, N3), (N3, N6) and (N6, N5) are connections of the NN. The other cycle is N5 itself, since (N5, N5) is a self-feedback connection in the example NN. Hence, N5, N3 and N6 are cyclic neurons. Observe that N6, N1, N2 and N5 form a path to a cyclic neuron, N5; that N4, N2 and N3 form another path to a cyclic neuron, N3; and that N4 and N6 form a third path to a cyclic neuron, N6. Therefore, the neurons, N4, N2, N6, N1, N5 and N3, together with the connections, (N4, N2), (N4, N6), (N2, N5), (N2, N3), (N6, N1) (N6, N5), (N6, N3), (N1, N2), (N5, N3), (N3, N6) and (N5, N5), form the recursive section of the example NN. The neurons, N8 and N7, together with the connections, (N4, N8), (N6, N8), (N3, N8), (N1, N7), (N5, N7), (N3, N7) and (N8, N7), form the nonrecursive section of the example NN. Since the activation functions of N1, N5, N3 and N8 are nonlinear, the only linear weights of the example NN are (N1, N7), (N5, N7), (N3, N7) and (N8, N7).

Depending on the structure, there are different types of NN: An NN with at least one delay connection is called a recurrent NN. An NN without a delay connection is called a nonrecurrent NN. An NN with at least one cyclic neuron is called a recursive NN. An NN without a cyclic neuron is called a nonrecursive NN. While a nonrecursive NN has an empty recursive section, a recursive NN has a nonempty recursive section. We note that a recursive NN must be a recurrent NN, but a recurrent NN may not be a recursive NN. A recurrent NN is a discrete-time dynamic system with all the activation levels of the recurrent NN, that are held by the delay connections at a time, as its dynamic state at the time. The dynamic state of a recurrent NN, in which an operation of the recurrent NN is initiated, is called the initial dynamic state of the recurrent NN for the operation. The components (or activation levels) of an initial dynamic state of a recurrent NN are viewed as weights of the recurrent NN. By the weights of an NN, we refer to the weights of the connections, the parameters of the neurons, and the components of the initial dynamic state, that exist in the NN. Recurrent NNs are usually used to process processes. The sequence of outputs from a recurrent NN is called the output process of the recurrent NN. The sequence of inputs to a recurrent NN is called the input process of the recurrent NN.

Training a neural network means determining and/or adjusting some or all of the weights of the NN substantially through a process of reducing the value of a training criterion by the variation of these weights. The training criterion is a mathematical function of these weights, that is defined using simulated, experimental, and/or experiential/ operational data about the operating environment of the NN to reflect (i.e. bring about the characteristics of) the performance for the NN in its intended application. These data that are used to construct the training criterion are called the training data. Some of the weights of an NN may be set equal to real numbers including 0 and 1, which are held constant throughout the trainings of the NN, while the other weights are determined and/or adjusted during trainings. The former weights are called the fixed weights and the latter weights are called the adjustable weights of the NN. The fixed weights of an NN that belong to the NN therein are called the fixed weights of the NN. The adjustable weights of the NN are similarly defined. The totality of the adjustable weights of the NN are denoted by w unless specified otherwise. The phrase, "determine and/or adjust," is abbreviated by either "determine" or "adjust." This holds for all tenses of the phrase. Training an NN can be performed either online or offline. The adjustable weights of an NN are adjusted only in a training.

The collection of all the NNs with some common configurational feature(s) is called an NN paradigm. For instance, the existence or nonexistence of a connection among the neurons in a neuron layer is a configurational feature. The collection of all the NNs of the same NN paradigm that have the same number of neurons of each type, the same number of delay connections, the same number of delayless connections, the same number of input neurons, the same number of output neurons, and the same configuration thereof is called an NN architecture. In other words, two NNs are of the same architecture if and only if they are identical except with possibly different weights on the connections, different parameters in the neurons, and/or different initial dynamic states. Whenever these connection weights, neuron parameters, and/or initial dynamic state are specified for an NN architecture, the NN is completely specified. Recall that these connection weights, neuron parameters and/or initial dynamic state of an NN are all called the weights of the NN, unless a distinction between the connection weights, the neuron parameters, and/or initial dynamic state is necessary and made clear in the context.

A recursive filter that is a recursive NN is called a recursive neurofilter. Recursive neurofilters that are a primary recursive filter and an ancillary recursive filter are called a primary and an ancillary recursive neurofilter respectively. The training data for training a recursive NN into a recursive neurofilter is a collection of realizations ω of the operating environment of the recursive neurofilter, that are recorded jointly at the same time in computer simulations, actual experiments, past experiences/ operations, or a combination thereof with the signal and information processes. This collection of realizations is called a training data set denoted by S.

The training criterion here is a mathematical function of the adjustable weights of the recursive NN, that is defined using the collection S of realizations of the operating environment to reflect (i.e. bring about the characteristics of) the estimation error criterion selected for the intended application of the recursive neurofilter. It is emphasized that training a recursive NN into a recursive neurofilter in accordance with the teachings of the present invention is performed offline, and thus all the adjustable weights of a recursive neurofilter are held fixed online.

Figure 9:
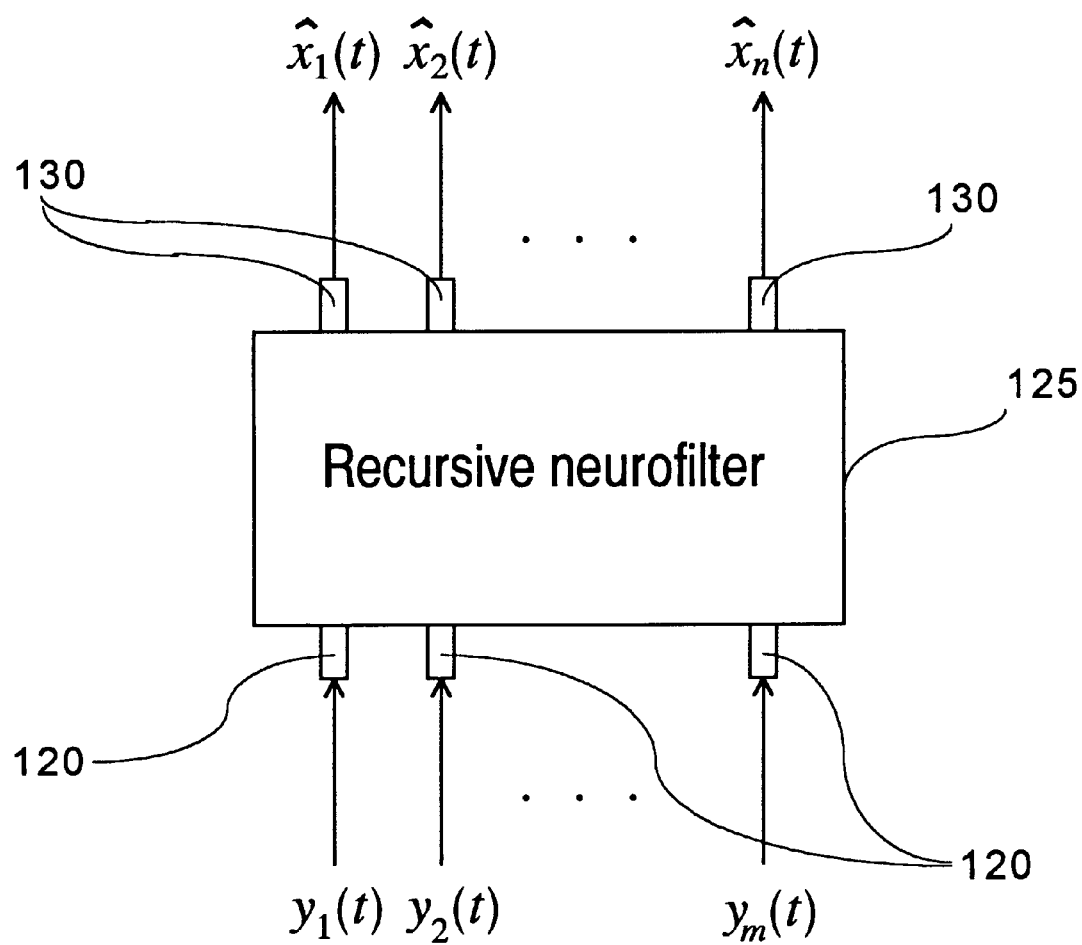
FIG. 9 shows a recursive neurofilter receiving an information vector $(y_1(t), y_2(t), \ldots, y_m(t))$ at the input terminals 120 of the recursive neurofilter and sending out an estimate $(\hat{x}_1(t), \hat{x}_2(t), \ldots, \hat{x}_n(t))$ of a signal vector $(x_1(t), x_2(t), \ldots, x_n(t))$ at the output terminals 130 of the recursive neurofilter at time t. The recursive neurofilter comprises a recursive neural network 125.

In accordance with the present invention, the training data are synthesized into a recursive neurofilter by training and testing at least one recursive NN and selecting one as the recursive neurofilter in consideration of the filtering performance versus the amount of online computation to maximize the cost effectiveness. Of course, this selected recursive neurofilter has to be implemented into an apparatus, which is also called a recursive neurofilter. If the signal and information processes, denoted by x(t) and y(t), are n and m dimensional vector sequence respectively, the recursive neurofilter for estimating x(t) needs to have n output neurons and m input neurons, which output an estimate $\hat{x}(t)$ of the signal vector and input the information vector respectively at time t. FIG. 9 shows such an implemented recursive neurofilter, in which a trained, tested and selected recursive NN 125 has n output neurons directly connected to the output terminals 130 of the recursive neurofilter and m input neurons directly connected to the input terminals 120 of the recursive neurofilter.

Figure 10:
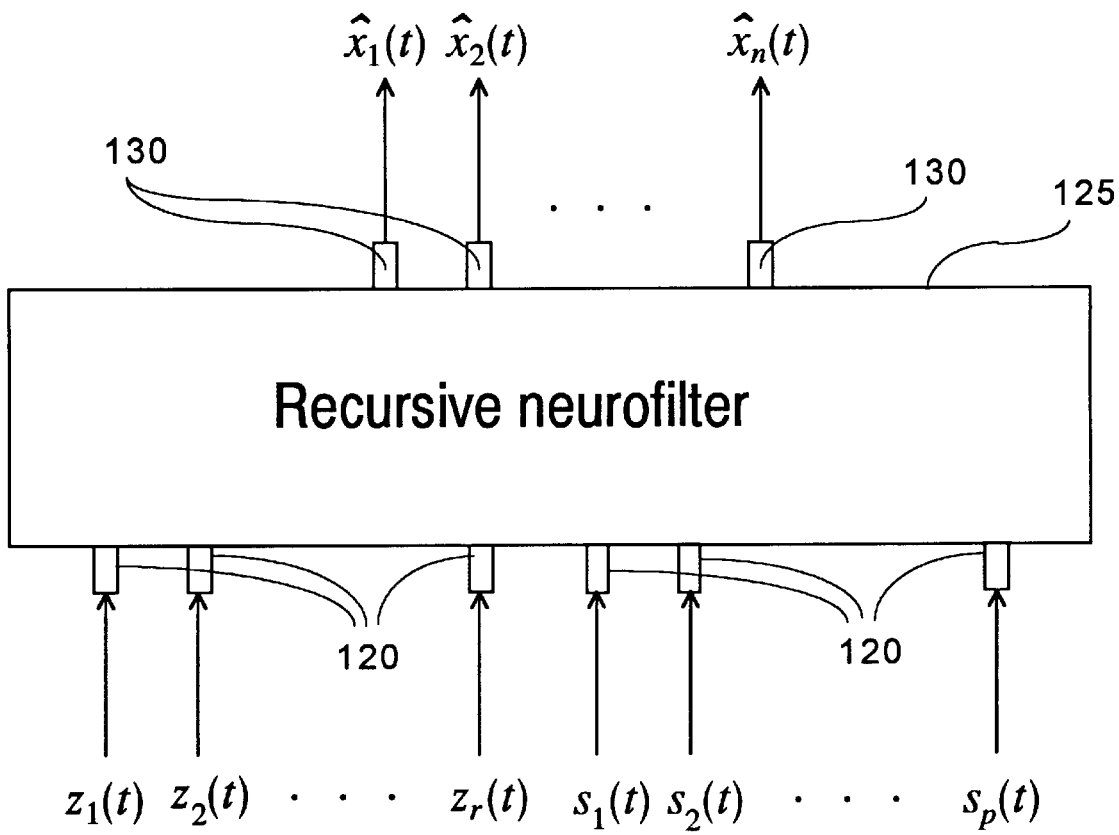
FIG. 10 shows a recursive neurofilter that receives an information vector comprising a measurement vector $(z_1(t), z_2(t), \ldots, z_r(t))$ and a time variance process $(s_1(t), s_2(t), \ldots, s_p(t))$ at the input terminals 120 of the recursive neurofilter, and sends out the estimate $(\hat{x}_1(t), \hat{x}_2(t), \ldots, \hat{x}_n(t))$ of a signal vector $(x_1(t), x_2(t), \ldots, x_n(t))$ at the output terminals of the recursive neurofilter at time t. The recursive neurofilter comprises a recursive neural network 125.

Recall that an information process may or may not comprise a time variance process, depending on whether the signal and measurement processes are time-variant and we want to include a time variance process describing this time variance properties in the information process. However, if the signal and measurement processes are time-variant, we prefer to include a time variance process describing this time variant properties in the information process lest large numbers of connections and neurons are required of the recursive neurofilter (without inputing such a time variance process) for "memorizing" the time-variant properties, especially when the length of the time interval, over which filtering is performed, is long. FIG. 10 shows a recursive neurofilter with output terminals 130 outputing an estimate $\hat{x}(t)$ of the signal vector x(t) and with input terminals 120 inputing an information vector respectively at time t, the information vector consisting of the measurement vector $(z_1(t), z_2(t), \ldots, z_r(t))$ and the time variance vector $(s_1(t), s_2(t), \ldots, s_p(t))$.

Example Neural Network Paradigms

Some example NN paradigms are described in the following.

Figure 4:
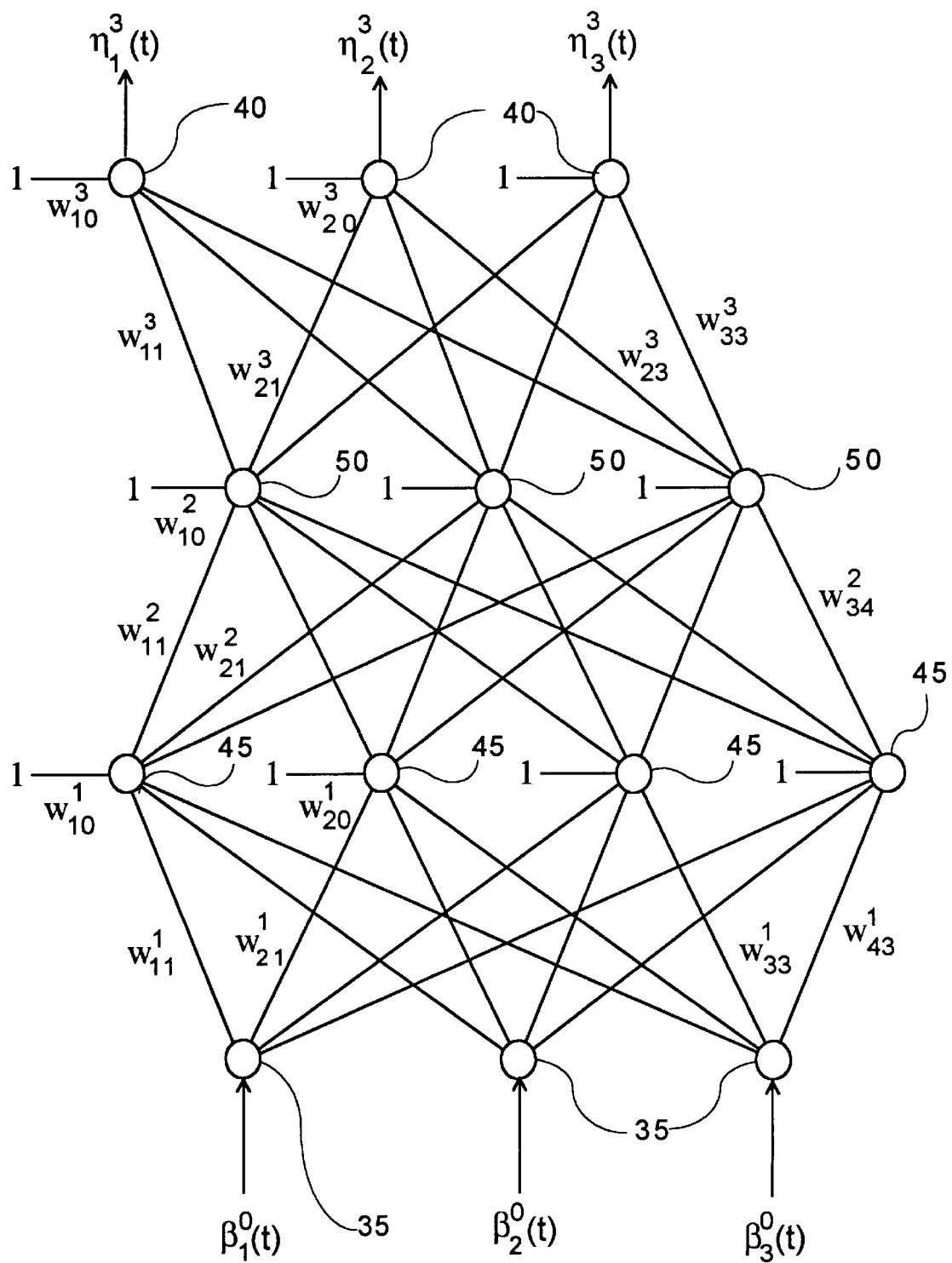
FIG. 4 shows an example multilayer perceptron (MLP). It has 3 input neurons 35 in the zeroth layer, 4 hidden neurons 45 in the first layer, 3 hidden neurons 50 in the second layer, and 3 output neurons 40 in the third and last layer. All the neurons are of the kind shown in FIG. 2. The input neurons 35, whose activation functions are the identity function, simply distribute the exogenous input, $(\beta_1^0(t), \beta_2^0(t), \beta_3^0(t))$, to the neurons in the first layer. The output neurons 40, whose activation functions are also the identity function, are summers, producing outward output, $(\eta_1^3(t), \eta_2^3(t), \eta_3^3(t))$. The activation functions of the neurons in the first and second layers are the hyperbolic tangent, tanh x. All the connections in the example MLP are delayless connection.

1. Multilayer perceptrons (MLPs): MLPs are perhaps the most popular NN paradigm. An example MLP is depicted in FIG. 4. It has 3 input neurons 35 in the zeroth layer, 4 hidden neurons 45 in the first layer, 3 hidden neurons 50 in the second layer, and 3 output neurons 40 in the third and last layer. All the neurons are of the kind shown in FIG. 2. The input neurons 35, whose activation functions are the identity function, simply distribute the exogenous input, $(\beta_1^0(t),$ $\beta_2^0(t)$, $\beta_3^0(t)$), to the neurons in the first layer. The output neurons 40, whose activation functions are also the identity function, are summers, producing outward output, ($\eta_1^3(t)$, $\eta_2^3(t)$, $\eta_3^2(t)$). The activation functions of the neurons in the first and second layers are the hyperbolic tangent, tanh x. All the connections in the example MLP are delayless connection.

The neurons in each layer are numbered from left to right in FIG. 4. The "numbering of a neuron" refers to this numbering in the neuron's layer. The symbol $w_{ij}^l$ denotes the weight on the delayless connection from neuron j in layer l−1 to neuron i in layer l. Only a few of the $w_{ij}^l$ are shown in FIG. 4 to avoid cluttering the figure. The bias for neuron i in layer l is denoted by $W_{i0}^l$, which is viewed as "the weight on the delayless connection leading into i in layer l from neuron 0 in layer l−1, whose activation level is set always equal to 1." Layer l of the MLP consists of the neurons in layer l and the connections leading into them. The totality of the weights in layer l is denoted by $w^l$.

Let us now see how the example MLP depicted in FIG. 4 processes information at time t. Recalling that component i of the input at time t is denoted by $\beta_i^0(t)$, the activation level $\beta_i^l(t)$ of neuron i in layer l and the weighted sum $\eta_i^l(t)$ in the same neuron at time t satisfy, for l=1, 2, $$\beta_i^l(t) = a_i^l(\eta_i^l(t)), \tag{7}$$

$$\eta_i^l(t) = w_{i0}^l + \sum_{j=1}^{n_{l-1}} w_{ij}^l \beta_j^{l-1}(t), \tag{8}$$

where $n_{l-1}$ denotes the number of neurons in layer l−1 and $a_i^l(x)$ is the activation function of neuron i in layer l. The output $\eta_i^L(t)$ for L=3, at output neuron i is then determined by $$\eta_i^L(t) = w_{i0}^L + \sum_{j=1}^{n_L} w_{ij}^L \beta_j^{L-1}(t). \tag{9}$$

Depending on the application, there can be, in an MLP, any number L of layers, any number $n_0$ of input neurons, any number $n_L$ of output neurons, and any number $n_l$ of neurons in each hidden layer l. Although the hyperbolic tangent function tanh x and the logistic function $1/(1+e^{-x})$ are perhaps most widely used as the activation functions in the MLPs in the literature, another function or functions selected from the group consisting of sigmoidal, wavelet, spline, polynomial, rational, trigonometric and exponential functions can also be used as the activation functions $a_i^l$ in MLPs to make the processors in the adaptive neural systems in accordance with the present invention. It is noted that all the MLPs with one and the same activation function for hidden neurons form one MLP paradigm. It will be appreciated that there may be more than one type of activation function in an MLP paradigm and the activation function of an input neuron does not have to be an identity function. By setting some delayless weights $w_{ij}$ equal to zero, differently configured MLPs, which are not fully connected, can be obtained. Notice that the equations, (7), (8) and (9), for l=1, . . . , L−1, possibly with some minor modifications are valid for the processing of most MLPs.

Since there are no delay connections in an MLP, it does not have a recursive section and is thus a nonrecursive NN. If all the output neurons are summers, equation (9) is valid for every output component of an MLP. Hence all the weights, $w_{ij}^L$, in layer L, appear linearly in the MLP's outputs and are thus linear weights of the MLP. Since every other weight appears in the MLP's outputs through nonlinear activation functions, the weights, $w^L$, constitute the linear section of the MLP.

Figure 5:
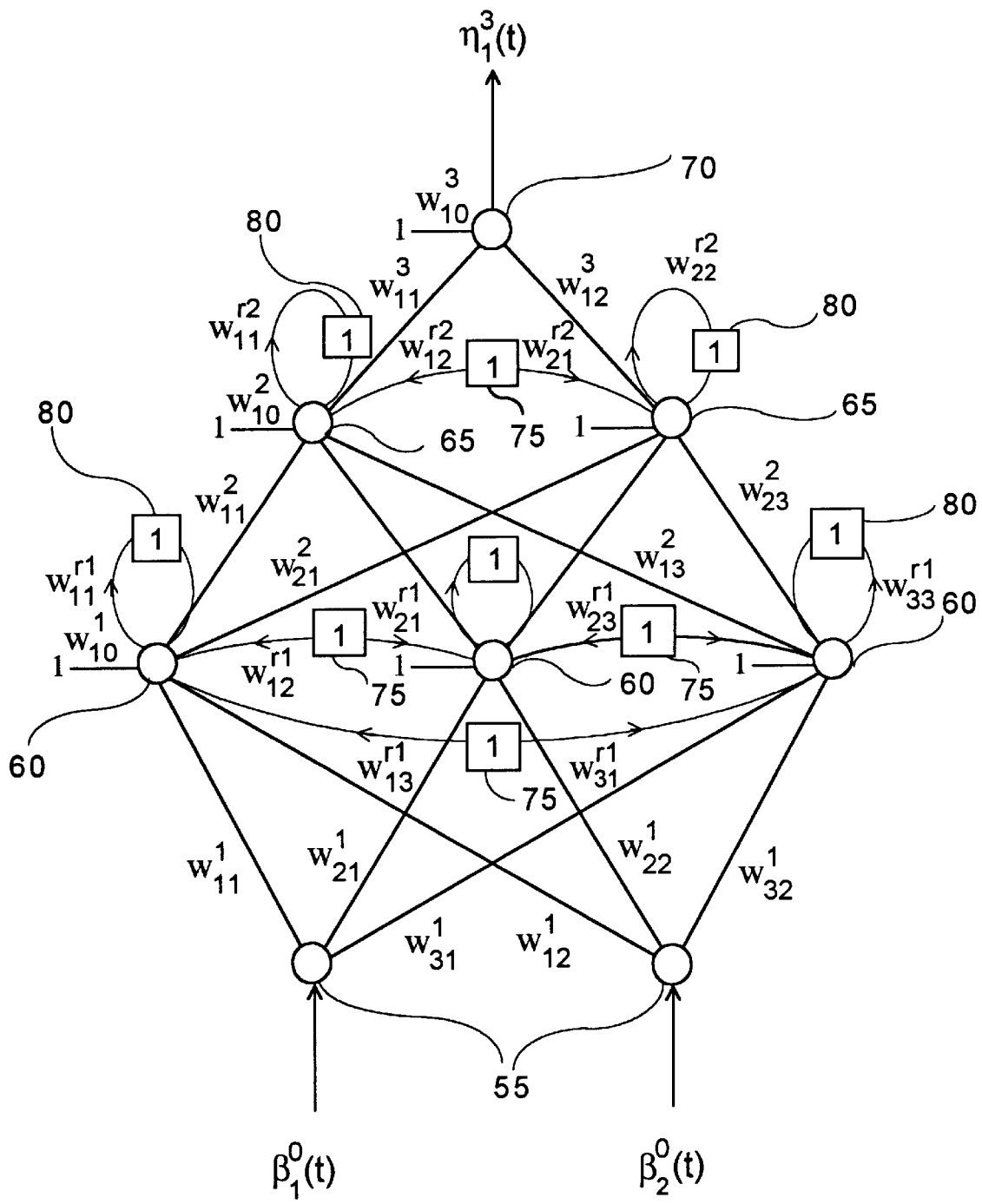
FIG. 5 shows an multilayer perceptron with interconnected neurons (MLPWIN). It has 2 input neurons 55, 1 output neuron 70, and 2 layers 60, 65 of neurons. The first layer has 3 neurons 60 and the second layer has 2 neurons 65. The input and output neurons are regarded as the neurons in layer 0 and layer 3 respectively. Since the neurons in layers 1 and 2 do not interact directly with outside the MLPWIN, they are hidden neurons and their layers are hidden layers. Every pair of hidden neurons in a layer are interconnected with 2 delay connections, one in each direction. Every delay connection has a unit time delay device. One line with two opposite arrow heads and a box 75 containing the numeral 1 is used to represent such two connections interconnecting two hidden neurons in a layer. All the neurons are of the kind shown in FIG. 2. The input neurons 55, whose activation functions are the identity function, simply distribute the exogenous input, $(\beta_1^0(t), \beta_2^0(t))$, to the neurons in the first layer. The output neuron 70, whose activation functions are also the identity function, are summers, producing outward output, $\eta_1^3(t)$. The activation functions of the neurons in the first and second layers are the hyperbolic tangent, tanh x.

2. Multilayer perceptrons with interconnected neurons (MLPWINs): An MLPWIN is formed with a multilayer perceptron (MLP) by connecting some or all of the neurons in at least one layer of the MLP. There is a unit time delay device on each such connection, making it a delay connection. MLPWINs first appeared in J. L. Elman, "Finding Structures in Time," Cognitive Science, Vol. 14, pp. 179–211 (1990). An example MLPWIN is depicted in FIG. 5. It has 2 input neurons 55, 1 output neuron 70, and 2 layers 60, 65 of neurons. The first layer has 3 neurons 60 and the second layer has 2 neurons 65. The input and output neurons are regarded as the neurons in layer 0 and layer 3 respectively. Since the neurons in layers 1 and 2 do not interact directly with outside the MLPWIN, they are called hidden neurons and their layers are called hidden layers. All the neurons are of the kind shown in FIG. 2. The input neurons 55, whose activation functions are the identity function, simply distribute the exogenous input, ($\beta_1^0(t)$, $\beta_2^0(t)$), to the neurons in the first layer. The output neuron 70, whose activation functions are also the identity function, are summers, producing outward output, $\eta_1^3(t)$. The activation functions of the neurons in the first and second layers are the hyperbolic tangent, tanh x.

The neurons in each layer are numbered from left to right in FIG. 5. The "numbering of a neuron" refers to this numbering in the neuron's layer. The symbol $w_{ij}^l$ denotes the weight on the delayless connection from neuron j in layer l−1 to neuron i in layer l. For notational simplicity, the bias for neuron i in layer l is denoted by $w_{i0}^l$, which is viewed as the "the weight on the delayless connection leading into neuron i in layer l from neuron 0 in layer l−1, the activation level of neuron 0 being set always equal to 1." The symbol $w_{ij}^{rl}$ denotes the weight on the delay connection from neuron j to neuron i in the same layer l. If i≠j, the two delay connections associated with $w_{ij}^{rl}$ and $w_{ji}^{rl}$ between neuron i and neuron j in layer l are indicated in FIG. 5 by the opposite arrow heads on the same line connecting the neurons. The box 80 enclosing the number 1 between the opposite arrow heads denotes a unit time delay device that the weighted activation levels of neuron i and j go through before they are fedback to neurons j and i respectively. The weight for self-feedback of neuron i in layer l is denoted by $w_{ii}^{rl}$. The self-feedback is also delayed by one time unit by a unit time delay device 80 in the FIG. 5. Layer l of the MLPWIN consists of the neurons in layer l and the connections leading into them. The totality of the delay weights, $w_{ij}^{rl}$, in layer l is denoted by $w^{rl}$. The totality of the delayless weights, $w_{ij}^l$, in layer l is denoted by $w^l$.

Figure 6:
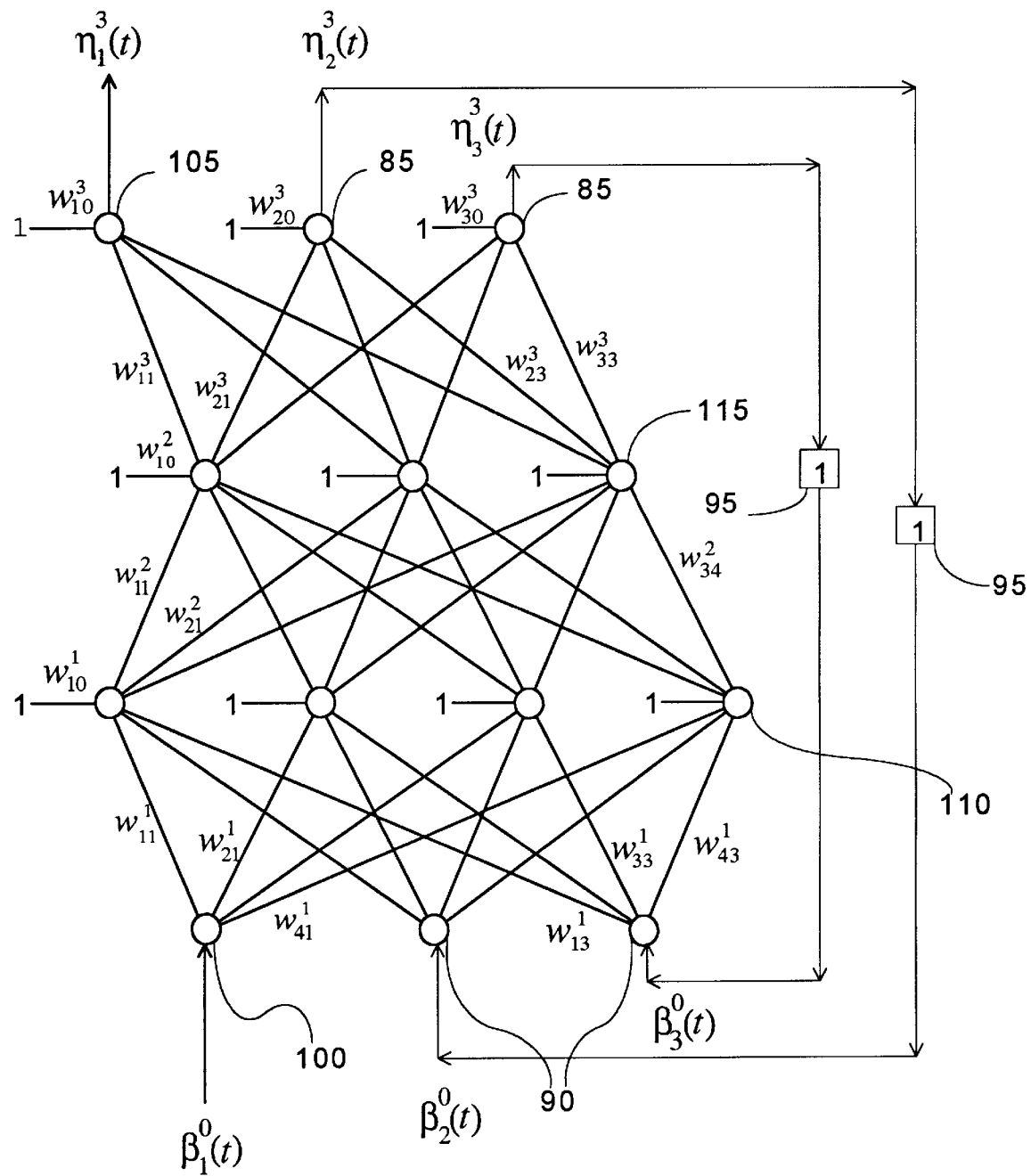
FIG. 6 is a schematic diagram of a typical multilayer perceptron with output feedbacks (MLPWOF). The MLPWOF has 2 free-feedback-sending neurons 85 each connected to a free-feedback-receiving neuron 90 through a unit time delay device 95. The free-feedback-sending neurons 85 shown in FIG. 6 are summers. However, free-feedback-sending neurons may also be neurons (or neurons) of another type or types. There is one input neuron 100 in the MLPWOF, which receives input data from outside the network, and one output neuron 105, which sends output data to outside the network.

Let us now see how the MLPWIN depicted in FIG. 5 processes information at time t. Denoting component i of the input to the MLPWIN at time t by $\beta_i^0(t)$, the activation level $\beta_i^l(t)$ of neuron i in layer l and the weighted sum $\eta_i^l(t)$ in the same neuron at time t satisfy, for l=1, 2, $$\beta_i^l(t) = a_i^l(\eta_i^l(t)) \tag{10}$$

$$\eta_i^l(t) = w_{i0}^l + \sum_{j=1}^{n_{l-1}} w_{ij}^l \beta_j^{l-1}(t) + \sum_{j=1}^{n_l} w_{ij}^{rl} \beta_j^l(t-1), \tag{11}$$

where $n_l$ denotes the number of neurons in layer l, $a_i^l(x)$ is the activation function of neuron i in layer l, and $\beta_i^l(t-1)$, for i=1, 2, . . . , $n_l$ and l=1, 2, form the dynamic state of the MLPWIN at time t. The dynamic state at time t=1 or at some other time for the performance of the MLPWIN to start being considered is called the initial dynamic state of the MLPWIN. The output $\eta_1^3(t)$ of the MLPWIN depicted in FIG. 6 is then determined by $$\eta_i^L(t) = w_{i0}^L + \sum_{j=1}^{n_{L-1}} w_{ij}^L \beta_j^{L-1}(t), \quad (12)$$

where L=3, i=1, and $n_{L-1}$=2.

Depending on the application, there can be, in an MLPWIN, any number L of layers, and any number $n_l$ of neurons in each layer l, for l=0, ..., L. Although only the hyperbolic tangent function tanh x and the logistic function $1/(1+e^{-x})$ have been used as the activation functions in the MLPWINs in the literature, other functions such as any wavelet, spline, polynomial, rational, trigonometric and exponential function can also be used as the activation function in accordance with the present invention to make neural systems. Another activation function worth mentioning here is $x/(1+|x|)$, which was recently proposed in D. L. Elliott, "A Better Activation Function for Artificial Neural Networks," ISR Technical Report TR 93-8, Institute for Systems Research, University of Maryland, College Park, Md. (1993). It is noted that all the MLPWINs with one and the same activation function for hidden neurons form one MLPWIN paradigm. It will be appreciated that there may be more than one type of activation function in an MLPWIN paradigm and the activation function of an input neuron does not have to be an identity function. By setting some delayless weights $w_{ij}^l$ and/or delay weights $w_{ij}^{rl}$ equal to zero, differently configured MLPWINs can be obtained. Notice that the equations, (10), (11) and (12), for l=1, ..., L−1, with possibly some minor modifications are valid for the processing of most MLPWINs.

In an MLPWIN, a neuron with a self-feedback delay connection and/or in a cycle within a layer is a cyclic neuron. All such cyclic neurons and those neurons and/or connctions that have a path leading to one of these cyclic neurons constitute the recursive section of the MLPWIN. The rest of the neurons and connections of the MLPWIN form the nonrecursive section. If all the output neurons are summers, equation (12) is valid for every output component of the MLPWIN. Hence all the weights, $w_{ij}^L$, in layer L, appear linearly in the MLPWIN's outputs and are thus linear weights of the MLPWIN. If all hidden neurons are nonlinear, every other weight appears in the MLPWIN's outputs through these nonlinear neurons, and hence, the weights, $w_{ij}^L$, constitute the linear section of the MLPWIN.

Figure 7:
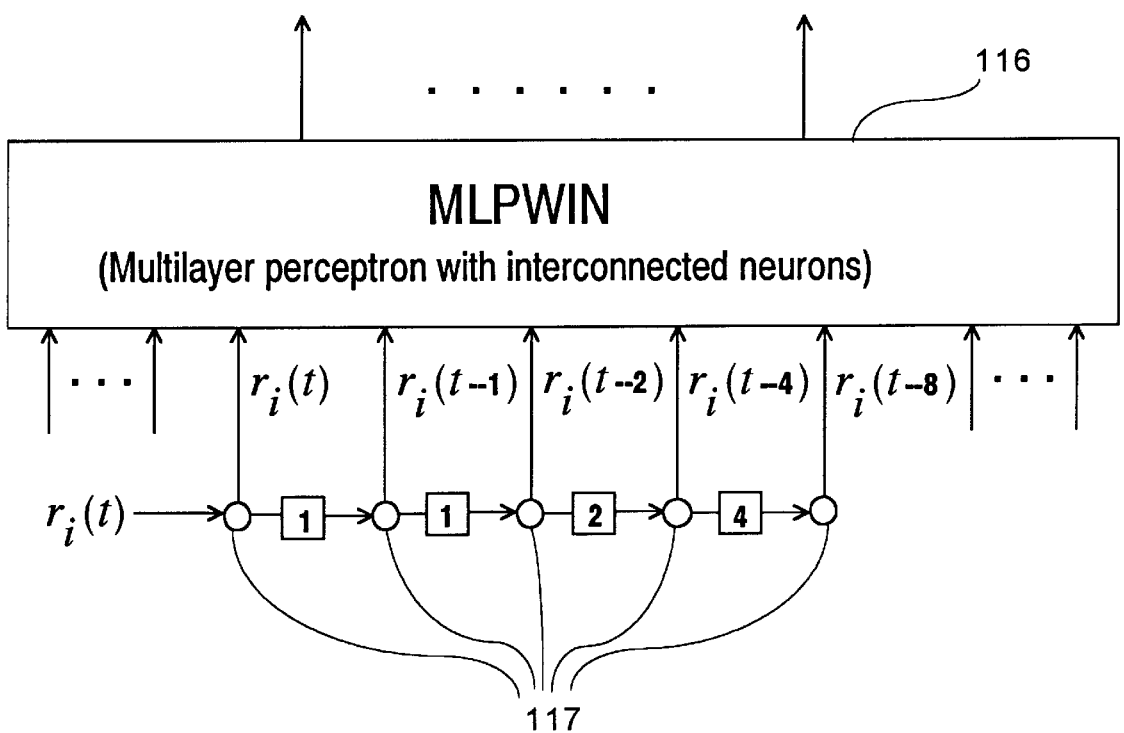
FIG. 7 shows an example MLPWINTP with an MLPWIN 116 and one example tapped delay line consisting of five neurons 117 and four delay connections. Each of these five neurons has an identity activation function and simply passes (or distributes) its single input to its outputs. Receiving a component $r_i(t)$ of the input process of the MLPWINTD, the example tapped delay line shown in FIG. 7 holds $r_i(t), r_i(t-1), r_i(t-2), r_i(t-4)$, and $r_i(t-8)$ as input components for the MLPWIN 116 at time t.

3. Multilayer perceptrons with interconnected neurons and tapped delay lines (MLPWINTPs): An MLPWINTP is a neural network formed with an MLPWIN and tapped delay lines. FIG. 7 shows an MLPWIN 116 with one example tapped delay line consisting of five neurons 117 and four delay connections in an example MLPWINTP. Each of these five neurons has an identity activation function and simply passes (or distributes) its single input to its outputs. Receiving a component $r_i(t)$ of the input process of the MLPWINTD, the example tapped delay line shown in FIG. 7 holds $r_i(t)$, $r_i(t-1)$, $r_i(t-2)$, $r_i(t-4)$, and $r_i(t-8)$ as input components for the MLPWIN 116 at time t.

4. Multilayer perceptrons with output feedbacks (MLPWOFs): An MLPWOF is formed with a multilayer perceptron (MLP) by connecting some or all of its last layer neurons (i.e. the output neurons of the MLP) to some of its zeroth layer neurons (i.e. the input neurons of the MLP). There is a unit time delay device on each such connection. The outputs of an MLPWOF are the processing results of the MLPWOF. They usually enter the training criterion directly and are forced to approach some target (or desired) outputs of the MLPWOF in training.

Those last layer neurons that are connected to some zeroth layer neurons (i.e. the input neurons of the MLP) are called feedback-sending neurons. If a feedback-sending neuron is also an output neuron, it is called an output-feedback-sending neuron. Otherwise, it is called a free-feedback-sending neuron. Similarly, a zeroth layer neuron is called an output-feedback-receiving neuron or a free-feedback-receiving neuron, depending on whether the zeroth layer neuron is connected to an output-feedback-sending or a free-feedback-sending neuron. Those zeroth layer neurons that receive inputs from outside the MLPWOF are called input neurons.

MLPWOFs first appeared in M. I. Jordan, "Attractor Dynamics and Parallelism in a Connectionist Sequential Machine," In *Proceedings of the Eighth Annual Conference of the Cognitive Science Society*, pp. 531–546, Erlbaum (1986). However, in all of the MLPWOFs' applications to system identification/control and signal processing, that can be found in the literature, the feedback-sending neurons of an MLPWOF include all of the output neurons.

Preferred MLPWOFs for making neural systems, in accordance with the teaching of this invention, have only free feedbacks. A typical MLPWOF with only free feedbacks is depicted in FIG. 6. The MLPWOF has 2 free-feedback-sending neurons 85 each connected to a free-feedback-receiving neuron 90 through a unit time delay device 95, which is indicated by a solid square as before. The free-feedback-sending neurons 85 shown in FIG. 6 are summers. However, free-feedback-sending neurons may also be neurons (or neurons) of another type or types. There is one input neuron 100 in the MLPWOF, which receives input data from outside the network, and one output neuron 105, which sends output data to outside the network.

The MLPWOF in FIG. 6 has 4 neurons 110 in the first layer of neurons and 3 neurons 115 in the second layer. The internal function of a neuron in layers 1 and 2 is shown in FIG. 7 and explained previously. In short, the weighted sum 108 in the neuron is $w_0 + \sum_{i=1}^n w_i I_i$ and the activation level 110 of the neuron is $a(w_0 + \sum_{i=1}^n w_i I_i)$, where the activation function a(x) is a sigmoid function such as the hyperbolic tangent function tanh x and the logistic function $1/(1+e^{-x})$.

The 3 neurons 90, 100 and 3 neurons 85, 105 are regarded as neurons in layer 0 and layer 3 respectively. The neurons in layers 1 and 2 are regarded as neurons in their respective layers. Since the neurons in layers 1 and 2 do not interact directly with outside the MLPWOF, they are called hidden neurons or neurons, and their layers are called hidden layers. The 3 neurons in layer 0 simply distribute the feedbacks to the neurons in layer 1. Each of the 3 neurons in layer 3 evaluates the weighted sum of the activation levels of the neurons in layer 2. All neurons in each layer are numbered from left to right. An input neuron here can be viewed as a neuron, that has only a single input and whose activation function is the identity function, a(x)=x. An output neuron here can be viewed as a neuron whose activation function is also the identity function. Therefore, the words, "neuron" and "neuron", are interchangeable.

The neurons in each layer are numbered from left to right here. The "numbering of a neuron" refers to this numbering in the neuron's layer. The symbol $w_{ij}^l$ denotes the weight on the delayless connection from neuron j in layer l−1 to neuron i in layer l. Only a few of the $w_{ij}^l$ are shown in FIG. 6 to avoid cluttering the figure. The bias for neuron i in layer l is denoted by $w_{i0}^l$, which is viewed as "the weight on the delayless connection leading into i in layer l from neuron 0 in layer l−1, whose activation level is set always equal to 1."

Let us now see how the MLPWOF depicted in FIG. 6 processes information at time t. Denoting input i at time t by $\beta_i^0(t)$, the activation level $\beta_i^l(t)$ of neuron i in layer l and the weighted sum $\eta_i^l(t)$ in the same neuron at time t satisfy, for l=1, 2, $$\beta_i^l(t) = a(\eta_i^l(t)), \qquad (13)$$

$$\eta_i^l(t) = w_{i0}^l + \sum_{j=1}^{n_{l-1}} w_{ij}^l \beta_j^{l-1}(t), \qquad (14)$$

where $n_{l-1}$ denotes the number of neurons in layer l−1 and a(x) is the activation function. The output $\eta_i^3(t)$ at output terminal i is then determined by $$\eta_i^3(t) = w_{i0}^3 + \sum_{j=1}^{3} w_{ij}^3 \beta_j^2(t). \qquad (15)$$

The feedbacks, $\eta_2^3(t)$ and $\eta_3^3(t)$, are fedback to the feedback-receiving terminals 90 after a unit time delay. Therefore the feedbacks at these terminal, $\beta_2^0(t)$ and $\beta_3^0(t)$, are equal to $\eta_2^3(t-1)$ and $\eta_3^3(t-1)$ respectively. The activation levels, $\eta_2^3(0)$ and $\eta_3^3(0)$, of the feedback-sending neurons 85 at time t=0 form the initial dynamic state of the MLPWOF.

Depending on the application, there can be, in an MLPWOF, any number of input neurons, output neurons, free feedbacks, output feedbacks, and layers, and any number of neurons in each hidden layer. Although only the hyperbolic tangent function tanh x and the logistic function 1/(1+e$^{-x}$) have been used as the activation function in the MLPWOFs in the literature, other functions such as any wavelet, spline, polynomial, rational, trigonometric and exponential function can also be used as the activation function, in accordance with the present invention, to make the neural systems. It is noted that all the MLPWOFs with one and the same activation function for hidden neurons form one MLPWOF paradigm. It will be appreciated that there may be more than one type of activation function in an MLPWOF paradigm and the activation function of an input neuron does not have to be an identity function.

Figure 8:
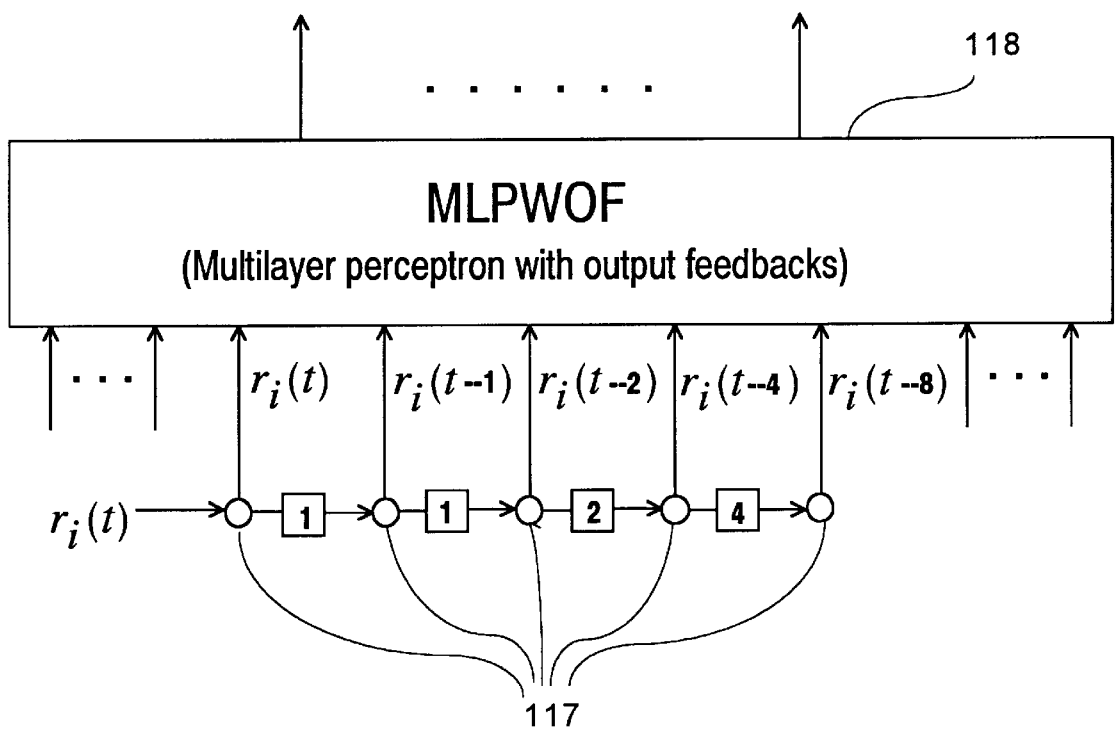
FIG. 8 shows an example MLPWOFTP with an MLPWOF 118 and one example tapped delay line consisting of five neurons 117 and four delay connections. Each of these five neurons has an identity activation function and simply passes (or distributes) its single input to its outputs. Receiving a component $r_i(t)$ of the input process of the MLPWOFTD, the example tapped delay line shown in FIG. 8 holds $r_i(t), r_i(t-1), r_i(t-2), r_i(t-4)$, and $r_i(t-8)$ as input components for the MLPWOF 118 at time t. An MLPWOFTD may also have tapped delay lines for holding delayed components of the MLPWOF's output process as input components for the same MLPWOF in the MLPWOFTD.

5. Multilayer perceptrons with output feedbacks and tapped delay lines (MLPWOFTPs): An MLPWOFTP is a neural network formed with an MLPWOF and tapped delay lines. FIG. 8 shows an MLPWOF 118 with one example tapped delay line consisting of five neurons 117 and four delay connections in an example MLPWOFTP. Each of these five neurons has an identity activation function and simply passes (or distributes) its single input to its outputs. Receiving a component $r_i(t)$ of the input process of the MLPWOFTD, the example tapped delay line shown in FIG. 8 holds $r_i(t)$, $r_i(t-1)$, $r_i(t-2)$, $r_i(t-4)$, and $r_i(t-8)$ as input components for the MLPWOF 118 at time t. An MLPWOFTD may also have tapped delay lines for holding delayed components of the MLPWOF's output process as input components for the same MLPWOF in the MLPWOFTD.

6. Radial basis function networks (RBFNs): Radial basis function networks (RBFNs) were first proposed to approximate probability density functions in the 1960s. Only Gaussian activation functions were used then, but numerous other activation functions have been used in a large number of research papers ever since. Nevertheless, all the RBFNs in the literature are neural networks without delay connections and with a single layer of hidden neurons (or processing units).

A typical neuron of an RBFN is depicted in FIG. 1. It is a composition of a basis function 5 and an activation function 15, which are denoted by b and a respectively. If the inputs to the neuron are $I_1, I_2, \ldots, I_n$ as shown in FIG. 1, the basis function 5 with parameters $w_1, w_2, \ldots, w_n$, is usually the Euclidean distance between the vectors $(I_1, I_2, \ldots, I_n)$ and $(w_1, w_2, \ldots, w_n)$, i.e.

$$b(I_1, I_2, \cdots, I_n, w_1, w_2, \cdots, w_n) = \sqrt{\sum_{i=1}^{n} (I_i - w_i)^2},$$

whose value appears at 10. The activation function 15 can be any one of many functions such as the Gaussian function, $$a(x, w_0) = \exp(-x^2/w_0^2),$$

the thin-plate-spline function, $$a(x, w_0) = x^2 \log x,$$

the multiquadric function, $$a(x, w_0) = (x^2 + w_0^2)^{1/2},$$

and the inverse multiquadric function, $$a(x, w_0) = (x^2 + w_0^2)^{-1/2},$$

where $w_0$ is another parameter of the neuron. The activation level of the neuron is its output at 20.

If we replace the MLP neurons with the RBFN neurons in the hidden layers of an MLP (e.g. FIG. 4), we obtain an RBFN. Thus the NNs in FIG. 4 can be viewed as an example RBFN. Here we note that $w_{ij}^l$ denotes a parameter of the i-th neuron in the l-th layer and that the weights on the connections are set equal to one.

Let us now see how the RBFN depicted in FIG. 4 processes information at time t. Denoting component i of the exogenous input at time t by $\beta_i^0(t)$, the activation level $\beta_i^l(t)$ of neuron i in layer l and the basis function output $\eta_i^l(t)$ in the same neuron at time t satisfy, for l=1, 2, $$\beta_i^l(t) = a(\eta_i^l(t), w_{i0}^l) = \exp\left[-(\eta_i^l(t))^2 / (w_{i0}^l)^2\right], \qquad (16)$$

$$\eta_i^l(t) = \left[\sum_{j=1}^{n_{l-1}} (\beta_j^{l-1}(t) - w_{ij}^l)^2\right]^{1/2}, \qquad (17)$$

where $n_{l-1}$ denotes the number of neurons in layer l−1. The output $\eta_i^3(t)$ at output neuron i is then determined by $$\eta_i^L(t) = w_{i0}^L + \sum_{j=1}^{n_{L-1}} w_{ij}^L \beta_j^{L-1}(t), \qquad (18)$$

where L=3, $n_{L-1}$=3, and i=1, 2, 3.

Depending on the application, there can be, in an RBFN, any number L of layers, any number $n_0$ of input neurons, any number $n_L$ of output neurons, and any number $n_l$ of neurons in each hidden layer l. It is noted that all the RBFNs with one and the same activation function for hidden neurons form one RBFN paradigm. It will be appreciated that there may be more than one type of activation function in an RBFN paradigm and the activation function of an input neuron does not have to be an identity function. By setting some delayless weights $w_{ij}$ equal to zero, differently configured RBFNs, which are not fully connected, can be obtained. Notice that the equations, (16), (17) and (18), for l=1, . . . , L−1, possibly with some minor modifications are valid for the processing of most RBFNs.

Since there are no delay connections in an RBFN, it does not have a recursive section and is thus a nonrecursive NN. If all the output neurons are summers, equation (18) is valid for every output component of an RBFN. Hence all the weights, $w_{ij}^L$, in layer L, appear linearly in the RBFN's outputs and are thus linear weights of the RBFN. Since every other weight appears in the RBFN's outputs through nonlinear activation functions, the weights, $w_{ij}^L$, constitute the linear section of the RBFN.

7. Radial basis function networks with interconnected neurons (RBFNWINs): If we replace the MLPWIN neurons with the RBFN neurons in the hidden layers of an MLPWIN (e.g. FIG. 5) we obtain an RBFNWIN. Let us now see how the example RBFNWIN shown in FIG. 5 processes information at time t. Here we assume that the basis function is the Euclidean distance and the activation function is the Gaussian function. Denoting component i of the input to the RBFNWIN at time t by $\beta_i^0(t)$, the activation level $\beta_i^l(t)$ of neuron i in layer l and the basis function output $\eta_i^l(t)$ in the same neuron at time t satisfy, for l=1, 2, $$\beta_i^l(t) = a(\eta_i^l(t), w_{i0}^l) = \exp\left[-(\eta_i^l(t))^2 / (w_{i0}^l)^2\right] \quad (19)$$

$$\eta_i^l(t) = \left[\sum_{j=1}^{n_{l-1}} (\beta_j^{l-1}(t) - w_{ij}^l)^2 + \sum_{j=1}^{n_l} (\beta_j^l(t-1) - w_{ij}^{rl})^2\right]^{1/2}, \quad (20)$$

where $n_l$ denotes the number of neurons in layer l, and $\beta_i^l(t-1)$, for i=1, . . . , $n_l$ and l=1, 2, form the dynamic state of the example RBFNWIF at time t. The output $\eta_1^3(t)$ of the example RBFNWIN in FIG. 5 is then determined by $$\eta_i^L(t) = w_{i0}^L + \sum_{j=1}^{L} w_{ij}^L \beta_j^{L-1}(t). \quad (21)$$

Depending on the application, there can be, in an RBFNWIN, any number L of layers, and any number $n_l$ of neurons in each layer l, for l=0, . . . , L. It is noted that all the RBFNWINs with one and the same activation function for hidden neurons form one RBFNWIN paradigm. It will be appreciated that there may be more than one type of activation function in an RBFNWIN paradigm and the activation function of an input neuron does not have to be an identity function. By setting some delayless weights $w_{ij}^l$ and/or delay weights $w_{ij}^{rl}$ equal to zero, differently configured RBFNWINs can be obtained. Notice that the equations, (19), (20) and (21), for l=1, . . . , L−1, with possibly some minor modifications are valid for the processing of most RBFNWINs.

In an RBFNWIN, a neuron with a self-feedback delay connection and/or in a cycle within a layer is a cyclic neuron. All such cyclic neurons and those neurons and/or connections that have a path leading to one of these cyclic neurons constitute the recursive section of the RBFNWIN. The rest of the neurons and connections of the RBFNWIN form the nonrecursive section. If all the output neurons are summers, equation (12) is valid for every output component of the RBFNWIN. Hence all the weights, $w_{ij}^L$, in layer L, appear linearly in the RBFNWIN's outputs and are thus linear weights of the RBFNWIN. Since every other weight appears in the RBFNWIN's outputs through nonlinear activation functions, the weights, $w_{ij}^L$, constitute the linear section of the RBFNWIN.

Preferred Neural Network Paradigms

Two theorems, discovered and proven by the inventor, state that, if a recursive neurofilter is made out of either an MLPWIN with a single hidden layer of enough neurons or an MLPWOF with enough free output feedbacks and a single hidden layer of enough neurons, the recursive neurofilter can generate an estimate $\hat{x}(t)$ of the signal x(t), that approximates the minimum variance (or least-squares) estimate of x(t) to any degree of accuracy over an arbitrary finite time interval [1, T]. Here the MLPWOF is fully-forwardly-connected as shown in FIG. 6 and MLPWIN is both fully-forwardly-connected and fully-laterally-interconnected (i.e. with neurons in each hidden layer fully interconnected) as shown in FIG. 5. These recursive NNs will simply be said to be fully-connected. The activation function used in the MLPWIN or MLPWOF is a bounded and nondecreasing function, which is not a constant. The foregoing approximation accuracy is measured by the mean square error, $(1/T)\tau_{t=1}^T E[\|E[x(t)|y(\tau), \tau=1, 2, \ldots, t] - \hat{x}(t)\|^2]$, where the conditional expectation $E[x(t)|y(\tau), \tau=1, 2, \ldots, t]$ of the signal x(t) given the measurements $y(\tau), \tau=1, 2, \ldots, t$ is known to be the minimum variance estimate, and $\hat{x}(t)$ is the output vector of the recursive neurofilter and $\|\cdot\|$ denotes the Euclidean norm. The two theorems are proven under the assumption that the signal process x(t) has finite second moments (i.e. $E[\|x(t)\|^2] < \infty$, t=1, 2, . . . , T) and the range of the values of the measurement process is bounded (i.e. $\|y(t)\| < B$, t=1, 2, . . . , T, for some finite positive number B).

Since only the number of hidden neurons needs to be determined for an MLPWIN with a single layer of hidden neurons, but both the number of hidden neurons and the number of free output feedbacks need to be determined for an MLPWOF with a single layer of hidden neurons, the former recursive NN is preferred to the latter recursive NN for constructing a recursive neurofilter, unless there is an application-related reason to indicate otherwise. Even when an recursive NN with a plurality of hidden layers is required, an MLPWIN is preferable, because a corresponding MLPWOF with the same MLP structure always has one more number to determine, that is the number of free output feedbacks.

The aforetated two theorems are still valid, if the words "MLPWIN" and "MLPWOF" are replaced with "MLPWINTD" and "MLPWOFTD" respectively. In fact, the use of tapped delay lines in an MLPWINTD (or MLPWOFTD) usually allows a significant reduction of the numbers of connections and neurons in the MLPWIN (or respectively MLPWOF) in the MLPWINTD (or respectively MLPWOFTD). Therefore, MLPWINTDs should be the first NN paradigm to try in synthesizing a recursive neurofilter, unless there is an application-related reason to suggest otherwise.

Estimation Error Criteria and Training Criteria

There are many types of estimation error criterion. However, only three types of estimation error criterion and their corresponding training criteria will be herein stated. For each type, a set of estimation error statistics will be described and an ancillary signal process will be defined, of which the estimation provides approximate values of the estimation error statistics. In the following, it is assumed that a training data set is available, which consists of exemplary realizations, (y(t, ω), x(t, ω)), t=1, 2, ..., T, ω∈S, of the information and signal processes, y(t) and x(t). If ω∈S, the symbol ω, which represents an exemplary realization, is also viewed as a sample index. The symbol S, which represents the set of exemplary realizations, is also viewed as a sample set containing all values of the sample index. The number of elements in S is denoted by #S. This training data set will sometimes be referred to as the primary training data set to avoid confusion with another training data set to be defined. The totality of adjustable weights of a recursive NN under training is denoted by w, which we recall includes the adjustable connection weights, neuron parameters, and initial dynamic state components of the recursive NN.

The most commonly used estimation error criterion is undoubtedly the mean square error $E[\|x(t)-\hat{x}(t)\|^2]$, where $\hat{x}(t)$ is an estimate of a signal process x(t) to be estimated, the estimate being a function of y(1), y(2), ..., y(t). When the criterion is minimized, $\hat{x}(t)$ is called the minimum variance (or least-squares) estimate of x(t). To reflect this estimation error criterion, a training criterion, which incorporates the given training data set and is also called the mean square error criterion, is $$Q(w) = \frac{1}{T(\#S)} \sum_{\omega \in S} \sum_{t=1}^{T} \|x(t, \omega) - \hat{x}(t, \omega, w)\|^2, \quad (22)$$

where x(t, ω) is the target output at t, and $\hat{x}$(t, ω, w) is the output of the same recursive NN, whose adjustable weights are denoted by w. We stress that $\hat{x}$(t, ω, w) is the output vector at t of the recursive NN, which has received, at its input neurons, the information vector sequence y(τ, ω), τ=1, 2, ..., t, one at a time in the given order.

Assume that a signal process x(t) is to be estimated with respect to the mean square error, and the conditional error covariance of the estimate at t given the past and current information vectors, y(τ), τ=1, 2, ..., t, is the estimation error statistics wanted. Hence the sequence of these conditional error covariances is the estimation error statistics process to be evaluated by an ancillary recursive neurofilter. Assume also that a given training data set has been synthesized into a primary recursive neurofilter with respect to Q(w), using one of the training methods to be described later on. Denoting the process that the primary recursive neurofilter outputs by $\hat{x}(t)$, we call $V(t) := (x(t)-\hat{x}(t))(x(t)-\hat{x}(t))^T$ an ancillary signal process (":=" denotes "is defined to be"). Hence, the wanted conditional error covariance of the estimate $\hat{x}(t)$ is the conditional expectation E[V(t)|y(1), y(2), ..., y(t)] of V(t) given the past and current information vectors, y(1), y(2), ..., y(t). This conditional expectation is the minimum variance estimate of V(t) minimizing $E[\|V(t)-\hat{V}(t)\|_F^2]$, where $\hat{V}(t)$ is an estimate of V(t) and $\|\cdot\|_F$ denotes the sum of squares of all the entries of the enclosed matrix.

To obtain a recursive neurofilter for estimating the ancillary signal process V(t) with respect to $E[\|V(t)-\hat{V}(t)\|_F^2]$, a corresponding training criterion is defined as $$Q_1(w) = \frac{1}{T(\#S)} \sum_{\omega \in S} \sum_{t=1}^{T} \|V(t, \omega) - \hat{V}(t, \omega, w)\|_F^2, \quad (23)$$

where $\|\cdot\|_F^2$ denotes the sum of squares of all the entries of the enclosed matrix and $\hat{V}$(t, ω, w) denotes the output matrix of the recursive neurofilter with adjustable weights w. This training criterion is called an ancillary training criterion. Furthermore, a training data set for synthesizing the recursive neurofilter is constructed as follows: Use the primary recursive neurofilter to generate $\hat{x}$(t, ω), t=1, 2, ..., T, for each information sequence y(t, ω), t=1, 2, ..., T in the primary training data set. Compute the corresponding realization $V(t, \omega) := (x(t, \omega)-\hat{x}(t, \omega))(x(t, \omega)-\hat{x}(t, \omega))^T$, t=1, 2, ..., T of the ancillary signal process V(t) for each ω∈S. Then the training data set consists of (y(t, ω), V(t, ω)), t=1, 2, ..., T and ω∈S, where y(t, ω) and V(t, ω) are the input sequence and the corresponding target (or desired) output sequence respectively. This training data set is called an ancillary training data set. A recursive neurofilter resulting from synthesizing such an ancillary training data set is an ancillary recursive neurofilter and must have m input neurons to receive the information vector y(t) and $n^2$ output neurons to send out an estimate $\hat{V}(t)$ of the ancillary signal process V(t). Recall that m and n are the dimensions of y(t) and x(t) respectively. $\hat{V}(t)$ is the desired estimation error statistics. It will be appreciated that we can use only part of the entries of V(t) (e.g. the diagonal entries) as the ancillary signal process.

Figure 11:
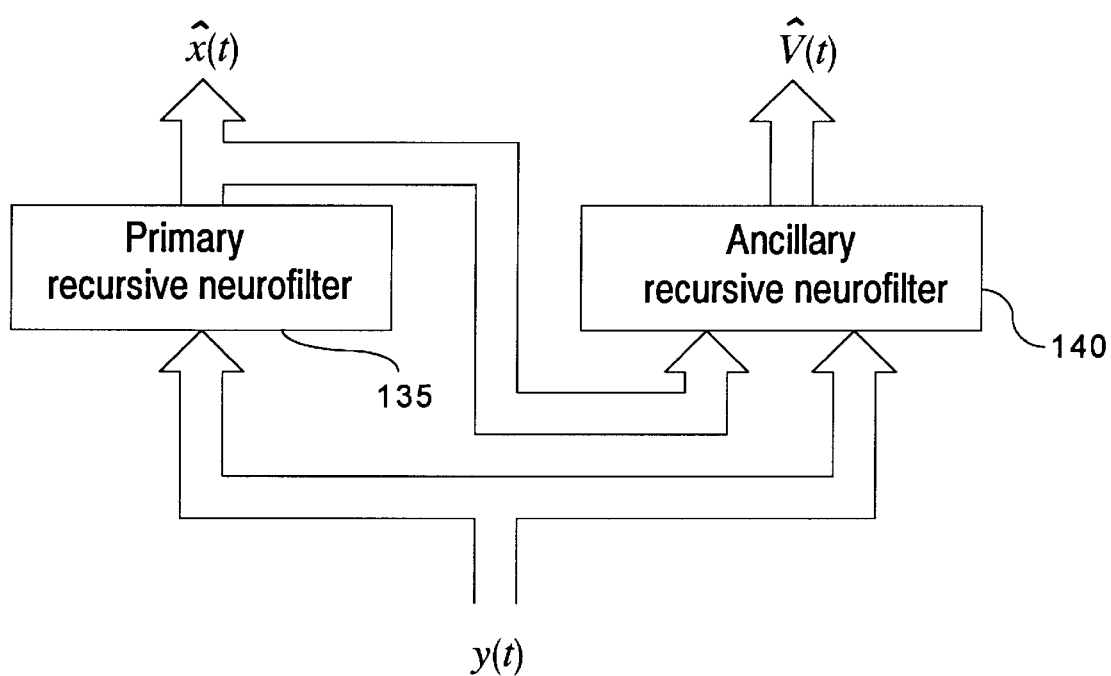
FIG. 11 shows one way that a primary recursive neurofilter 135 and an ancillary recursive neurofilter 140 are connected. The two neurofilters may share the same input neurons for inputing the information vector y(t). The ancillary neurofilter has additional input neurons for inputing the estimate $\hat{x}(t)$ from the output neurons of the primary recursive neurofilter. The ancillary neurofilter produces an estimate $\hat{V}(t)$ of the ancillary signal V(t).

An alternative ancillary training data set can be used. It consists of the realizations, V(t, ω), t=1, 2, ..., T, ω∈S as the target output sequences and the corresponding sequences (y(t, ω), $\hat{x}$(t, ω)), t=1, 2, ..., T, ω∈S as the input sequences. If this alternative ancillary training data set is used, the ancillary recursive neurofilter should have m+n input neurons, where m and n are the dimensions of y(t) and $\hat{x}(t)$ respectively. In operation, these trained primary 135 and ancillary 140 recursive neurofilters are connected as shown in FIG. 11. The output $\hat{x}(t)$ of the primary recursive neurofilter at time t is fed into the ancillary recursive neurofilter at the same time without a unit time delay. The ancillary recursive neurofilter processes its inputs $\hat{x}(t)$ and y(t) and produces $\hat{V}(t)$ as the recursive neurofilter's output at time t.

A problem with the mean square error criterion is that the signal outliers in the training data set tend to have undesirably large impact on the training results. An alternative training criterion is based on the well known mean absolute deviation $\Sigma_{i=1}^{n} E[|x_i(t)-\hat{x}_i(t)|]$, where $\hat{x}_i(t)$ is an estimate of the ith component $x_i(t)$ of a signal process x(t). The alternative training criterion, also called mean absolute deviation criterion, is written $$D(w) = \frac{1}{T(\#S)} \sum_{\omega \in S} \sum_{t=1}^{T} \sum_{i=1}^{n} |x_i(t, \omega) - \hat{x}_i(t, \omega, w)|, \quad (24)$$

where |·| denotes the absolute value and the other symbols are defined as for Q(w) above.

Assume that a signal process x(t) is to be estimated with respect to the mean absolute deviation criterion, and the conditional mean absolute deviation of the estimate at t given the past and current information vectors, y(τ), τ=1, 2, ..., t, is the estimation error statistics wanted. Hence the sequence of these conditional mean absolute deviations is the estimation error statistics process to be evaluated by an ancillary recursive neurofilter. Assume also that a given training data set has been synthesized into a primary recursive neurofilter with respect to D(w), using one of the training methods to be described later on. Denoting the process that the primary recursive neurofilter outputs by $\hat{x}(t)$, we call $V(t):=(|x_1(t)-\hat{x}_1(t)|, |x_2(t)-\hat{x}_2(t)|, \ldots, |x_n(t)-\hat{x}_n(t)|)$ an ancillary signal process (":=" denotes "is defined to be"). The wanted conditional mean absolute deviation of the estimate $\hat{x}(t)$ is the minimizer of $E[\Sigma_{i=1}^{n}|V_i(t)-\hat{V}_i(t)|]$ over all the functions $\hat{V}_i(t)$ of the past and current information vectors, y(1), y(2), ..., y(t). In other words, the wanted conditional mean absolute deviation is the optimal estimate of the ancillary signal process V(t) with respect to the estimation error criterion $E[\Sigma_{i=1}^{n}|V_i(t)-\hat{V}_i(t)|]$.

To obtain a recursive neurofilter for estimating the ancillary signal process V(t) with respect to $E[|\Sigma_{i=1}^{n}|V(t)-\hat{V}(t)|]$, a corresponding training criterion is defined as $$D_1(w) = \frac{1}{T(\#S)} \sum_{w \in S} \sum_{t=1}^{T} \sum_{i=1}^{n} |V_i(t, \omega) - \hat{V}_i(t, \omega, w)|, \quad (25)$$

where $\hat{V}(t, \omega, w)$ denotes the output vector of the recursive neurofilter with adjustable weights w. This training criterion is called an ancillary training criterion. Furthermore, a training data set for synthesizing the recursive neurofilter is constructed as follows: Use the primary recursive neurofilter to generate $\hat{x}(t, \omega, w)$, t=1, 2, ..., T, for each information sequence y(t, ω), t=1, 2, ..., T in the primary training data set. Compute the corresponding realization V(t, ω):=(|x_1(t, ω)-$\hat{x}_1$(t, ω)|, |x_2(t, ω)-$\hat{x}_2$(t, ω)|, ..., |x_n(t, ω)-$\hat{x}_n$(t, ω)|), t=1, 2, ..., T of the ancillary signal process V(t) for each ω∈S. Then the training data set consists of (y(t, ω), V(t, ω)), t=1, 2, ..., T and ω∈S, where y(t, ω) and V(t, ω) are the input sequence and the corresponding target (or desired) output sequence respectively. This training data set is called an ancillary training data set. A recursive neurofilter resulting from synthesizing such an ancillary training data set is an ancillary recursive neurofilter and must have m input neurons to receive the information vectors y(t) and n output neurons to send out an estimate $\hat{V}(t)$ of the ancillary signal process V(t). Recall that m and n are the dimensions of y(t) and x(t) respectively. $\hat{V}(t)$ is the desired estimation error statistics. It will be appreciated that we can use only part of the entries of V(t) as the ancillary signal process.

An alternative ancillary training data set can be used. It consists of the realizations, V(t, ω), t=1, 2, ..., T, ω∈S as the target output sequences and the corresponding sequences (y(t, ω), $\hat{x}$(t, ω)), t=1, 2, ..., T, ω∈S as the input sequences. If this alternative ancillary training data set is used, the ancillary recursive NN should have m+n input neurons, where m and n are the dimensions of y(t) and $\hat{x}$(t) respectively. In operation, these trained primary 135 and ancillary 140 recursive neurofilters are connected as shown in FIG. 11. The output $\hat{x}(t)$ of the primary recursive neurofilter at time t is fed into the ancillary recursive neurofilter at the same time without a unit time delay. The ancillary recursive neurofilter processes its inputs $\hat{x}(t)$ and y(t) and produces $\hat{V}(t)$ as the recursive neurofilter's output at time t.

An interesting estimation error criterion that combines the mean square error and the mean absolute deviation is the mean Huber's error $\Sigma_{i=1}^{n}E[\rho(x_i(t)-\hat{x}_i(t))]$, where $\rho(u)=u^2$, if $|u| \leq M$ and $\rho(u)=2M|u|-M^2$, if $|u|>M$ for the scalar variable u and some prechosen positive number M. Based on the mean Huber's error, a robust training criterion is written $$H(w) = \frac{1}{T(\#S)} \sum_{w \in S} \sum_{t=1}^{T} \sum_{i=1}^{n} E[\rho(x_i(t, \omega) - \hat{x}_i(t, \omega, w))], \quad (26)$$

where symbols other than ρ are defined as for Q(w). H(w) will also be called mean Huber's error criterion. The training criterion H(w) is twice differentiable except where $\rho=M^2$. Many of the optimization methods involving differentiation can be applied for it.

Assume that a signal process x(t) is to be estimated with respect to the mean Huber's error criterion, and the conditional mean Huber's error of the estimate at t given the past and current information vectors, y(τ), τ=1, 2, ..., t, is the estimation error statistics wanted. Hence the sequence of thses conditional mean Huber's errors is the estimation error statistics process to be evaluated by an ancillary recursive neurofilter. Assume also that a given training data set has been synthesized into a primary recursive neurofilter with respect to H(w), using one of the training methods to be described later on. Denoting the process that the primary recursive neurofilter outputs by $\hat{x}(t)$, we call V(t):=(ρ(x_1(t)-$\hat{x}_1$(t)), ρ(x_2(t)-$\hat{x}_2$(t)), ..., ρ(x_n(t)-$\hat{x}_n$(t))) an ancillary signal process (":=" denotes "is defined to be"). The wanted conditional mean Huber's error of the estimate $\hat{x}(t)$ is the minimizer of $\Sigma_{i=1}^{n}E[\rho(V_i(t)-\hat{V}_i(t))]$ over all the functions $\hat{V}_i(t)$ of the past and current information vectors, y(1), y(2), ..., y(t). In other words, the wanted conditional mean Huber's error is the optimal estimate of the ancillary signal process V(t) with respect to the estimation error criterion $\Sigma_{i=1}^{n}E[\rho(V_i(t)-\hat{V}_i(t))]$.

To obtain a recursive neurofilter for estimating the ancillary signal process V(t) with respect to $\Sigma_{i=1}^{n}E[\rho(V(t)-\hat{V}(t))]$, a corresponding training criterion is defined as $$H_1(w) = \frac{1}{T(\#S)} \sum_{w \in S} \sum_{t=1}^{T} \sum_{i=1}^{n} \rho(V_i(t, \omega) - \hat{V}_i(t, \omega, w)), \quad (27)$$

where $\hat{V}(t, \omega, w)$ denotes the output vector of the recursive neurofilter with adjustable weights w. This training criterion is called an ancillary training criterion. Furthermore, a training data set for synthesizing the recursive neurofilter is constructed as follows: Use the primary recursive neurofilter to generate $\hat{x}(t, \omega)$, t=1, 2, ..., T, for each information sequence y(t, ω), t=1, 2, ..., T in the primary training data set. Computethe corresponding realization V(t, ω):=(ρ(x_1(t, ω)-$\hat{x}_1$(t, ω)), ρ(x_2(t, ω)-$\hat{x}_2$(t, ω)), ..., ρ(x_n(t, ω)-$\hat{x}_n$(t, ω))), t=1, 2, ..., T of the ancillary signal process V(t) for each ω∈S. Then the training data set consists of (y(t, ω), V(t, ω)), t=1, 2, ..., T and ω∈S, where y(t, ω) and V(t, ω) are the input sequence and the corresponding target (or desired) output sequence respectively. This training data set is called an ancillary training data set. A recursive neurofilter resulting from synthesizing such an ancillary training data set is an ancillary recursive neurofilter and must have m input neurons to receive the information vectors y(t) and n output neurons to send out an estimate $\hat{V}(t)$ of the ancillary signal process V(t). Recall that m and n are the dimensions of y(t) and x(t) respectively. $\hat{V}(t)$ is the desired estimation error statistics. It will be appreciated that we can use only part of the entries of V(t) as the ancillary signal process.

An alternative ancillary training data set can be used. It consists of the realizations, V(t, ω), t=1, 2, ..., T, ω∈S as the target output sequences and the corresponding sequences (y(t, ω),$\hat{x}$(t, ω)), t=1, 2, ..., T, ω∈S as the input sequences. If this alternative ancillary training data set is used, the ancillary recursive NN should have m+n input neurons, where m and n are the dimensions of y(t) and $\hat{x}(t)$ respectively. In operation, these trained primary 135 and ancillary 140 recursive neurofilters are connected as shown in FIG. 11. The output $\hat{x}(t)$ of the primary recursive neurofilter at time t is fed into the ancillary recursive neurofilter at the same time without a unit time delay. The ancillary recursive neurofilter processes its inputs $\hat{x}(t)$ and y(t) and produces $\hat{V}(t)$ as the recursive neurofilter's output at time t.

Training Recursive Neural Networks

Synthesizing training data into a recursive neurofilter consists of training and testing at least one recursive NN from a selected recursive NN paradigm until the filtering performance of an recursive NN with respect to the selected estimation error criterion is satisfactory or can not be significantly improved by increasing the size of the recursive NN, whichever comes first, and then selecting a trained recursive NN as the recursive neurofilter in consideration of the online computation required versus filtering performance to optimize the cost effectiveness. It is emphasized again that training recursive NNs for the synthesis of a recursive neurofilter in accordance with the teachings of this invention are performed offline, and all the adjustable weights of a recursive neurofilter ad defined throughout this invention disclosure are held fixed online during the operation of said recursive neurofilter.

Once a training criterion is selected and training data collected, the training criterion is a well defined function of the adjustable weights w of the recursive NN under training. Recall that the adjustable weights w include the adjustable connection weights, neuron parameters and initial dynamic state components. The selected training criterion will now be denoted by C(w). Training the recursive NN is a problem of minimizing C(w) by the variation of w.

This training problem is simply one of the unconstrained optimization problems that are studied in a very large field of numerical and theoretical research by the name of optimization theory. There are basically two types of method for unconstrained optimization. One type, including the stochastic approximation, annealing and clustering methods, needs only evaluations of the optimization criterion and the other type needs also evaluations of its derivatives. These methods of both types and their pros and cons can be found in a large number of books and articles and will not be further discussed here. It is only stressed that any optimization method can be selected to train the selected recursive NN for filtering in accordance with the teachings of the present invention, provided that the selected training criterion together with the recursive NN satisfies the required conditions for the selected optimization method.

Nevertheless, due to the enormous number of adjustable weights (and the initial dynamic state components, if they are to be optimized as well) for even a small recursive NN and the usually enormous amount of training data, training an recursive NN into a recursive neurofilter involves a very large amount of computation. For instance, the MLPWIN in FIG. 5 has 33 weights and 5 initial dynamic state components, and the MLPWOF in FIG. 6 has 45 adjustable weights and 2 initial dynamic state components. Notwithstanding so many variables to be optimized, these recursive NNs are actually much smaller than most of the recursive NNs required to do real-world filtering.

Generally speaking, the type of optimization method that needs evaluations of the derivatives of the training criterion C(w) is more efficient and converges faster than other type. Due to the rich network structures of recursive NNs, many ideas for evaluating the derivatives of C(w) have been proposed. Perhaps the most widely used ideas are back-propagation through time (BPTT) and real-time recurrent learning (RTRL). BPTT and RTRL each provides an effective way to differentiate the training criterion C(w) with respect to the weights/parameters w of the recursive NN. The derivatives of C(w) with respect to the initial dynamic state can be obtained in a similar manner. The derivatives with respect to w can then be used in any one of the conventional optimization methods that need derivatives, such as the gradient descent methods, the conjugate gradient methods and the quasi-Newton methods. A good introduction to BPTT and RTRL ideas with adequate references can be found on pages 182–186 of J. Hertz, A. Krogh and R. G. Palmer, *Introduction to the Theory of Neural Computation*, Addison Wesley (1991). The BPTT and the RTRL formulas for computing the derivatives will be provided in the following in the form of algorithms. First, let us establish more notations.

An MLPWIN or an MLPWOF considered here is fully-connected and has L+1 layers of neurons including layer 0 containing the input neurons and layer L containing the output neurons. The set of the numberings of the input neurons in layer 0 is denoted by I and the set of the numberings of the output neurons in layer L is denoted by O. For the MLPWOF, the set of the numberings of the feedback input neurons is denoted by $F_I$ and the set of the numberings of the feedback output neurons is denoted by $F_O$. It is assumed without loss of generality that $F_I=F_O$ and if a feedback input neuron and a feedback output neuron are connected for feedback, these two neurons have the same numbering in their respective layers. Hence $F_I$ and $F_O$ are denoted by F.

Each neuron in the MLPWIN or MLPWOF, including neurons in layer 0 and layer L, has an individual activation function. The activation function of neuron i in layer l is denoted by $a_i^l(\eta)$. There can be any number of different activation functions in the MLPWIN or MLPWOF, each being shared by any number of neurons. The derivative of $a_i^l(\eta)$ with respect to $\eta$ is denoted by $(a_i^l)'(\eta)$.

The target (or desired) output sequence in a training set, that is indexed by $\omega \in S$, is denoted by $\alpha(t, \omega)$, $t=1, 2, \ldots, T$. For instance, the sequence $\alpha(t, \omega)$ is equal to $x(t, \omega)$ or $V(t, \omega)$, depending on whether the network (MLPWIN or MLPWOF) is trained to be a primary recursive neurofilter or an ancillary recursive neurofilter. The components of $\alpha(t, \omega)$ are assigned the same numberings as in O so that $\alpha_i(t, \omega)$ is the target value of neuron i in layer L for each $i \in O$. The corresponding activation level of neuron i in layer L is $\beta_i^L(t, \omega)$ in consistency with the usage of the symbol $\beta_i^L(t)$. If the activation functions $a_i^L(\eta)$, $i \in O$ are the identity function $a_i^L(\eta)=\eta$, $i \in O$, the activation level $\beta_i^L(t, \omega)$ is equal to $\eta_i^L(t, \omega)$, for each $i \in O$, as is the case in FIG. 5 and FIG. 6.

The input sequence in a training data set, that is indexed by $\omega \in S$, is denoted $\beta_i^0(t, \omega)$ in consistency with the usage of the symbol $\beta_i^0(t)$. For instance, the sequence $\beta_i^0(t, \omega)$ is equal to $y_i(t, \omega)$, for each $i \in I$, for training the network (MLPWIN or MLPWOF) as a primary recursive neurofilter, or as an ancillary recursive neurofilter if the output of the primary recursive neurofilter is not input to the ancillary recursive neurofilter. However, if the output of the primary recursive neurofilter is input to the ancillary recursive neurofilter, the components of the input sequence (y(t, $\omega$), x(t, $\omega$)) in the training data set are each assigned a numbering from I and the sequence $\beta_i^0(t, \omega)$ is set equal to the component of (y(t, $\omega$),x(t, $\omega$)) with the same numbering i.

Using these notations, the mean square error criterion Q(w) is now written as $$Q(w) = \frac{1}{T(\#S)} \sum_{w \in S} \sum_{t=1}^{T} \sum_{i \in O} (\alpha_i(t, \omega) - \beta_i^L(t, \omega))^2, \qquad (28)$$

where $\Sigma_{i \in O}$ denotes the summation over all i in O. Notice that $\beta_i^L(t, \omega)$ is a function of the adjustable weights w. For notational simplicity, the initial dynamic state $\beta(0)$ is denoted by v. An activation level in v is denoted by $v_i^l$, if the activation level is that of neuron i in layer l. In the following, the formulas for computing $dQ_\omega/dv_i^l$, $dQ_\omega/dw_{ij}^l$ and $dQ_\omega/$ $dw_{ij}^{rl}$ are given, where $Q_\omega := (1/(T(\#S)))\Sigma_{t=1}^T \Sigma_{i \in O}(\alpha_i(t, \omega) - \beta_i^L(t, \omega))^2$. Recall that ":=" denotes "is defined to be." The desired derivatives $dQ(w)/dv_i^l$, $dQ(w)/dw_{ij}^l$ and $dQ(w)/dw_{ij}^{rl}$ are then obtained easily by the equations, $dQ(w)/dv_i^l = \Sigma_{\omega \in S} dQ_\omega/dv_i^l$, $dQ(w)/dw_{ij}^l = \Sigma_{\omega \in S} dQ_\omega/dw_{ij}^l$ and $dQ(w)/dw_{ij}^{rl} = \Sigma_{\omega \in S} dQ_\omega/dw_{ij}^{rl}$, respectively.

To simplify the summation symbols, the symbol $\Sigma_i$ (or $\Sigma_j$) denotes the summation over all the numberings of the neurons in the layer that neuron i (or j) appears. For instance, $\Sigma_j w_{ij}^l \beta_j^{l-1} := \Sigma_{j=0}^{n_{l-1}}$ and $\Sigma_j w_{ji}^{l+1}(dQ_\omega/d\eta_j^{l+1}(t)) := \Sigma_{j=1}^{n_{l+1}} w_{ji}^{l+1}(dQ_\omega/d\eta_j^{l+1}(t))$. Furthermore, $\Sigma_t := \Sigma_{t=1}^T$, and $\delta_{ij}$ is the Kronecker delta, i.e. $\delta_{ij} := 1$, if $i = j$ and $\delta_{ij} = 0$, if $i \neq j$.

a. BPTT algorithm for an MLPWIN:

begin
1. For $l = 1, 2, \ldots, L$, do
   For $i = 1, 2, \ldots, n_l$, do $$\frac{dQ_\omega}{d\eta_i^l(T+1)} = 0$$

end;
end;
2. For $t = T, T-1, \ldots, 1$, do
   For $i = 1, 2, \ldots, n_L$, do $$\frac{dQ_\omega}{d\eta_i^L(t)} = \frac{\partial Q_\omega}{\partial \beta_i^L(t)} ((a_i^L)'(\eta_i^L(t)))$$

end;
   For $l = L-1, L-2, \ldots, 1$, do

For $i = 1, 2, \ldots, n_l$, do $$\frac{dQ_\omega}{d\eta_i^l(t)} = \left( \sum_j w_{ji}^{l+1} \frac{dQ_\omega}{d\eta_j^{l+1}(t)} + \sum_j w_{ji}^{rl} \frac{dQ_\omega}{d\eta_j^l(t+1)} \right) ((a_i^l)'(\eta_i^l(t)))$$

end;
   end;
end;
3. For $l = 1, 2, \ldots, L$, do
   For $i = 1, 2, \ldots, n_l$, do
      For $j = 0, 1, \ldots, n_{l-1}$, do $$\frac{dQ_\omega}{dw_{ij}^l} = \sum_t \frac{dQ_\omega}{d\eta_i^l(t)} \beta_j^{l-1}(t);$$

If $l \neq L$, then $\dfrac{dQ_\omega}{dw_{ij}^{rl}} = \sum_t \dfrac{dQ_\omega}{d\eta_i^l(t)} \beta_j^l(t-1)$ end;
   end;
end;
4. For $l = 1, 2, \ldots, L-1$, do
   For $i = 1, 2, \ldots, n_l$, do $$\frac{dQ_\omega}{dv_i^l} = \sum_t w_{ji}^{rl} \frac{dQ_\omega}{d\eta_j^l(1)}$$

∈end;
   end;
   end.
b. BPTT algorithm for an MLPWOF:

begin
1. For $i = 1, 2, \ldots, n_L$, do

If $i \in O$, then $\dfrac{dQ_\omega}{d\eta_i^L(T)} = \dfrac{\partial Q_\omega}{\partial \beta_i^L(T)} ((a_i^L)'(\eta_i^L(t)))$, else $\dfrac{dQ_\omega}{d\eta_i^L(T)} = 0$;

```
end;
2. For t = T, T − 1, . . . , 1, do
    For l = L − 1, L − 2, . . . , 1, do
        For i = 1, 2, . . . , n_l, do
```

$$\frac{d Q_\omega}{d \eta_i^l(t)} = \left( \sum_j w_{ji}^{l+1} \frac{d Q_\omega}{d \eta_j^{l+1}(t)} \right) ((a_i^l)'(\eta_i^l(t)))$$

```
        end;
    end;
    If t ≠ 1, then for each i ∈ F, do
```

$$\frac{d Q_\omega}{d \eta_i^L(t-1)} = \left( \sum_j w_{ji}^l \frac{d Q_\omega}{d \eta_j^l(t)} + \frac{\partial Q_\omega}{\partial \beta_i^L(t-1)} \right) ((a_i^L)'(\eta_i^L(t-1)))$$

```
    end;
end;
3. For l = 1, 2, . . . , L, do
    For i = 1, 2, . . . , n_l, do
        For j = 0, 1, . . . , n_{l−1}, do
```

$$\frac{d Q_\omega}{d w_{ij}^l} = \sum_t \frac{d Q_\omega}{d \eta_i^l(t)} \beta_j^{l-1}(t)$$

```
        end;
    end;
end;
4. For each i ∈ F, do
```

$$\frac{d Q_\omega}{d v_i^L} = \sum_j w_{ji}^l \frac{d Q_\omega}{d \eta_j^l(1)}$$

```
    end;
end.
``` c. RTRL algorithm for an MLPWIN:

```
begin
1. For k = 1, 2, . . . , L − 1, do
    For l = 1, 2, . . . , L − 1, do
        For i = 1, 2, . . . , n_l, do
            For p = 1, 2, . . . , n_k, do
```

$$\frac{d \beta_i^l(0)}{d v_p^k} = \delta_{lk} \delta_{ip};$$

```
                For q = 0, 1, . . . , n_{k−1}, do
```

$$\frac{d \beta_i^l(0)}{d w_{pq}^k} = 0$$

```
                end;
                For q = 1, 2, . . . , n_k, do
```

$$\frac{d \beta_i^l(0)}{d w_{pq}^{rk}} = 0$$

```
                end;
            end;
        end;
    end;
end;
2. for t = 1, 2, . . . , T, do
    For k = 1, 2, . . . , L − 1, do
        For l = k, k + 1, . . . , L, do
            For i = 1, 2, . . . , n_l, do
                For p = 1, 2, . . . , n_k, do
```

$$\frac{d\beta_i^l(t)}{dv_p^k} = \left((1-\delta_{kl})\sum_j w_{ij}^l \frac{d\beta_j^{l-1}(t)}{dv_p^k} + (1-\delta_{lL})\sum_j w_{ij}^{rl} \frac{d\beta_j^l(t-1)}{dv_p^k}\right)(a_i^l)'(\eta_i^l(t));$$

For $q = 0, 1, \ldots, n_{k-1}$, do $$\frac{d\beta_i^l(t)}{dw_{pq}^k} = \left((1-\delta_{kl})\sum_j w_{ij}^l \frac{d\beta_j^{l-1}(t)}{dw_{pq}^k} + (1-\delta_{lL})\sum_j w_{ij}^{rl} \frac{d\beta_j^l(t-1)}{dw_{pq}^k}\right.$$
$$\left. + \delta_{ip}\delta_{kl}\beta_q^{l-1}(t)\right)(a_i^l)'(\eta_i^l(t))$$

end;
For $q = 1, 2, \ldots, n_k$, do $$\frac{d\beta_i^l(t)}{dw_{pq}^{rk}} = \left((1-\delta_{kl})\sum_j w_{ij}^l \frac{d\beta_j^{l-1}(t)}{dw_{pq}^{rk}} + (1-\delta_{lL})\sum_j w_{ij}^{rl} \frac{d\beta_j^l(t-1)}{dw_{pq}^{rk}}\right.$$
$$\left. + \delta_{ip}\delta_{kl}\beta_q^l(t-1)\right)(a_i^l)'(\eta_i^l(t))$$

end;
end;
end;
∈end;
end;
end;
3. For $l = 1, 2, \ldots, L-1$, do
   For $p = 1, 2, \ldots, n_l$, do $$\frac{dQ_\omega}{dv_p^l} = \sum_t \sum_{i \in O} \frac{\partial Q_\omega}{\partial \beta_i^L(t)} \frac{d\beta_i^L(t)}{dv_p^l};$$

For $q = 0, 1, \ldots, n_{l-1}$, do $$\frac{dQ_\omega}{dw_{pq}^l} = \sum_t \sum_{i \in O} \frac{\partial Q_\omega}{\partial \beta_i^L(t)} \frac{d\beta_i^L(t)}{dw_{pq}^l}$$

end;
  For $q = 1, 2, \ldots, n_l$, do $$\frac{dQ_\omega}{dw_{pq}^{rl}} = \sum_t \sum_{i \in O} \frac{\partial Q_\omega}{\partial \beta_i^L(t)} \frac{d\beta_i^L(t)}{dw_{pq}^{rl}}$$

end;
end;
end;
4. For $p = 1, 2, \ldots, n_L$, do
  For $q = 0, 1, \ldots, n_{L-1}$, do $$\frac{dQ_\omega}{dw_{pq}^L} = \sum_t \frac{\partial Q_\omega}{\partial \beta_p^L(t)} \beta_q^{L-1}(t)(a_p^L)'(\eta_p^L(t));$$

end;
end;
end.
d. RTRL algorithm for an MLPWOF:

begin
1. For $t = 1, 2, \ldots, T$, do
  For each $i \in I$, do
    Foe each $p \in F$, do $$\frac{d\beta_i^0(t)}{dv_p^L} = 0$$

```
        end;
    For l = 1,2, ..., L, do
        For p = 1,2, ..., n_l, do
            For q = 0,1, ..., n_{l-1}, do
```
$$\frac{d\beta_i^0(t)}{dw_{pq}^l} = 0$$

```
            end;
        end;
    end;
end;
2. For each k ∈ F, do
    For each p ∈ F, do
```
$$\frac{d\beta_k^0(1)}{dv_p^L} = \delta_{kp}$$

```
    end;
    For l = 1,2, ..., L, do
        For p = 1,2, ..., n_l, do
            For q = 0,1, ..., n_{l-1}, do
```
$$\frac{d\beta_k^0(1)}{dw_{pq}^l} = 0$$

```
            end;
        end;
    end;
end;
3. For t = 1,2, ..., T, do
    For k = 1,2, ..., L, do
        For p = 1,2, ..., n_k, do
            For q = 0,1, ..., n_{k-1}, do
                For l = 1,2, ..., L, do
                    For i = 1,2, ..., n_l, do
```
$$\frac{d\beta_i^l(t)}{dw_{pq}^k} = \left(\sum_j w_{ij}^l \frac{d\beta_j^{l-1}(t)}{dw_{pq}^k} + \delta_{ip}\delta_{kl}\beta_q^{k-1}(t)\right)(a_i^l)'(\eta_i^l(t))$$

```
                    end;
                end;
                For each i ∈ F, do
```
$$\frac{d\beta_i^0(t-1)}{dw_{pq}^k} = \frac{d\beta_i^L(t)}{dw_{pq}^k}$$

```
                ∈end;
            end;
        end;
    end;
    For each p ∈ F, do
        For l = 1,2, ..., L, do
            For i = 1,2, ..., n_l, do
```
$$\frac{d\beta_i^l(t)}{dv_p^L} = \sum_j w_{ij}^l \frac{d\beta_j^{l-1}(t)}{dv_p^L}(a_i^l)'(\eta_i^l(t))$$

```
            end;
        end;
        For each i ∈ F, do
```
$$\frac{d\beta_i^0(t+1)}{dv_p^L} = \frac{d\beta_i^L(t)}{dv_p^L}$$

```
        end;
    end;
end;
4. For l = 1,2, ..., L, do
```

-continued

```
For p = 1,2, . . . , n_l, do
    For q = 0,1, . . . , n_{l-1}, do
```

$$\frac{dQ_\omega}{dw_{pq}^l} = \sum_t \sum_{i \in O} \frac{\partial Q_\omega}{\partial \beta_i^L(t)} \frac{d\beta_i^L(t)}{dw_{pq}^l};$$

```
    end;
  end;
end;
5. For each p ∈ F, do
```

$$\frac{dQ_\omega}{dv_p^L} = \sum_t \sum_{i \in O} \frac{\partial Q_\omega}{\partial \beta_i^L(t)} \frac{d\beta_i^L(t)}{dv_p^L};$$

```
  end;
end.
```

The derivatives $dH(w)/dw_{ij}^l$, $dH(w)/dw_{ij}^{rl}$, $dH(w)/dv_i^l$ of the mean Huber's error criterion $H(w)=(1/(T(\#S)))\Sigma_{\omega \in S}\Sigma_{t=1}^T\Sigma_{i=1}^n E[\rho(x_i(t, \omega)-\hat{x}_i(t, \omega, w))]$ can be computed using the foregoing formulas with $Q_\omega$ replaced by $H_\omega:=(1/(T(\#S)))\Sigma_{t=1}^T\Sigma_{i=1}^n E[\rho(x^i(t, \omega)-\hat{x}_i(t, \omega, w))]$. The derivatives of the mean square error criterion $Q_1(w)$ and the mean Huber's error criterion $H_1(w)$ for synthesizing training data into an ancillary recursive neurofilter can also be computed using the foregoing formulas with $Q_\omega$ replaced $Q_{1\omega}:=(1/(T(\#S)))\Sigma_{t=1}^T\|V(t, \omega)-\hat{V}(t, \omega, w)\|_F^2$ and $H_{1\omega}:=(1/(T(\#S)))\Sigma_{t=1}^T\Sigma_{i=1}^n\rho(V_i(t, \omega)-\hat{V}_i(t, \omega, w))$, respectively. In fact, the derivatives of any training criterion $C(w)$, that is expressible as $C(w)=\Sigma_{\omega \in S}C_\omega$, where $C_\omega$ is a function of the output vectors of the MLPWIN or MLPWOF under training and is differentiable with respect to w, can be computed using the foregoing formulas with $Q_\omega$ replaced by $C_\omega$.

The derivatives of $C(w)$ for an MLPWIN or an MLPWOF, that is not fully-connected, can be computed using the foregoing algorithms with a slight modification: If a connection or interconnect is missing in the recursive NN, its weight and all the derivatives with respect to the weight are set equal to zero and the steps of evaluating all these derivatives are skipped.

The derivatives $dC(w)/dw_{ij}^l$, $dC(w)/dw_{ij}^{rl}$ and $dC(w)/dv_i^l$ for an MLPWIN (or $dC(w)/dw_{ij}^l$ and $dC(w)/dv_i^l$ for an MLPWOF) computed in the foregoing algorithm constitute the gradient of $C(w)$ with respect to w for MLPWIN (or respectively MLPWOF). Given the gradient, to be denoted by $\nabla C(w)$, the gradient descent methods, the conjugate gradient methods and the quasi-Newton methods can be applied. There is a large variety of gradient descent methods, but a basic gradient descent method is an iterative method and improves the value of w in each iteration by $$w^{new}=w^{old}-\lambda \nabla C(w), \quad (29)$$

where $\lambda$ is a positive constant called the step size. The application of this basic gradient descent method to training recursive NNs is mentioned on pages 174 and 185 of J. Hertz, A. Krogh and R. G. Palmer, *Introduction to the Theory of Neural Computation*, Addison Wesley (1991). The conjugate gradient methods and the quasi-Newton methods are well-known methods for optimization. A good introduction to them can be found in D. G. Luenberger, *Linear and Nonlinear Programming*, second edition, Addison-Wesley (1973). Some ready to run routines that implement some powerful variants of these methods can be found in W. H. Press, S. A. Teukolsky, W. T. Vetterling and B. P. Flannery, *Numerical Recipes in C*, second edition, Cambridge University Press (1992). In the book, the routine for the conjugate gradient method is called frprmn (p.423) and the routine for the quasi-Newton method is called dfpmin (p.428). A floppy diskett containing the routines is provided in the book.

For evaluating the derivatives of $C(w)$, BPTT involves much less computation, but much more memory space than RTRL. For minimizing $C(w)$ given its derivatives, quasi-Newton and conjugate gradient methods require about the same amount of computation in each iteration, but the former converges faster than the latter. Quasi-Newton methods also need much more memory space than do conjugate gradient methods. Hence, if plenty of memory space is available in a computer, a combination of BPTT and a quasi-Newton method is preferred on the computer. However, if the memory space is limited in a computer for synthesizing given training data into a recursive neurofilter, a combination of RTRL and a conjugate gradient method is preferred on the computer. Different combinations are possible for different degrees of availability of the memory space in a computer.

Two somewhat different methods of training recursive NNs use extended Kalman filter (EKF) and are proposed in G. V. Puskorius and L. A. Feldkamp, "Recurrent Network Training with the Decoupled Extended Kalman Filter Algorithm," *Science of Artificial Neural Networks*, edited by D. W. Ruck, Proceedings SPIE 1710, pp. 461–473 (1992), and in R. J. Williams, "Training Recurrent Networks Using the Extended Kalman Filter," *Proceedings of the 1992 International Joint Conference on Neural Networks*, Baltimore, Md., pp. IV 241–246 (1992), which are incorporated herein by reference. These EKF methods also require evaluation of the derivatives of $C(w)$.

Another optimization method worth mentioning is the simultaneous perturbation stochastic approximation (SPSA) algorithms introduced by J. C. Spall, "Multivariate Stochastic Approximation Using a Simultaneous Perturbation Gradient Approximation," *IEEE Transactions on Automatic Control*, Volume 37, No. 3, pp. 332–341 (1992) and J. C. Spall, "Stochastic Version of Second-Order (Newton-Raphson) Optimization Using Only Function Measurements," *Proceedings of the 1995 Winter Simulation Conference*, edited by C. Alexopoulos and K. Kang (1995). Applied to a nonadaptive training, these algorithms require only evaluations of the nonadaptive training criterion, but do not require calculations of its derivatives.

Most of the foregoing optimization algorithms are iterative in nature. The adjustable weights of the neural system to be optimized are randomly selected at the beginning of the algorithm. If the initial dynamic state is to be optimized as well, it is either randomly selected or set equal to a canonical initial dynamic state at the beginning of the optimization process. The adjustable weights and initial dynamic state are then adjusted iteratively until the value of the training criterion ceases to improve by more than a preset small number, say $10^{-12}$.

It is known that most training criteria contain many undesired local minima, where a local search optimization method can get trapped. Therefore, if a local search method is used, it should be applied a number of times starting at different (randomly or systematically chosen) initial values for the optimization variables (i.e. the adjustable weights and sometimes, initial dynamic state of the neural system). Alternatively, a global search method such as an annealing method, a genetic algorithm or a clustering method can be used for training.

A standard statistical technique, known as cross-validation, can be used to improve or help ensure the generalization capability of a recursive neurofilter. The idea is to use a second training data set, S', that is collected in the same way as the first training data set, S, and is called the testing data set. A second training criterion, C', that is constructed using the testing data set in the same way the first training criterion, C, is constructed using the training data set, is called the test criterion. In the process of training a recursive NN, C' is evaluated for each new value of the vector variable w. The training process is stopped, if C' starts to increase significantly or if C' cannot be further decreased significantly.

Techniques for pruning a recurrent neural network, which are similar to those network-pruning techniques introduced in Simon Haykin, *Neural Networks—A Comprehensive Foundation*, pp. 205–212, Macmillan College Publishing Company, Inc. (1994) can reduce the number of connections (delayless and delay connections) and help improve the generalization capability of a recurrent NN under training. If a recurrent NN prunig method is applied, only those connections with adjustable weights whose being pruned does not significantly increase P and/or reduce the generalization capability of the NN are allowed to be pruned. The foregoing training result is modified by setting the weights of pruned connections equal to zero and setting the weights of all the connections incident to pruned neurons equal to zero.

CONCLUSION, RAMIFICATION, AND SCOPE OF INVENTION

Given a signal process and a measurement process, a recursive neurofilter is disclosed that processes an information process comprising the measurement process to estimate the signal process with respect to an estimation criterion. If the signal and measurement processes are time-variant, it is preferred that said information process comprise not only the measurment process but also a time variance process describing the time variant property of the signal and measurement processes. If some estimation error statistics is required, another recursive neurofilter can be used that produces approximates of these estimation error statistics.

While our description hereinabove contains many specificities, these should not be construed as limitations on the scope of the invention, but rather as an exemplification of preferred embodiments. In addition to these embodiments, those skilled in the art will recognize that other embodiments are possible within the teachings of the present invention. Accordingly, the scope of the present invention should be limited only by the appended claims and their appropriately construed legal equivalents.

What is claimed is:

1. A recursive neurofilter for estimating a signal process with respect to an estimation error criterion, said recursive neurofilter comprising a recursive neural network whose input process is an information process and wherein at least one adjustable weight is a nonlinear weight in said recursive neural network's recursive section and is determined in a training of said recursive neural network with respect to a training criterion defined to reflect said estimation error criterion said recursive neurofilter's adjustable weights being held fixed online during the operation of said recursive neurofilter.

2. The recursive neurofilter of claim 1 wherein said recursive neural network is a multilayer perceptron with interconnected neurons.

3. The recursive neurofilter of claim 1 wherein said recursive neural network is a multilayer perceptron with interconnected neurons and tapped delay lines.

4. The recursive neurofilter of claim 1 wherein said recursive neural network is a multilayer perceptron with output feedbacks.

5. The recursive neurofilter of claim 1 wherein said recursive neural network is a multilayer perceptron with output feedbacks and tapped delay lines.

6. The recursive neurofilter of claim 1 wherein said information process consists of a measurement process, said signal and measurement processes being time-invariant.

7. The recursive neurofilter of claim 1 wherein said information process consists of a measurement process and a time variance process that describes said signal and measurement processes' time-variant properties, said signal and measurement processes being time-variant.

8. An ancillary recursive neurofilter for evaluating an estimation error statistics process for a primary recursive neurofilter, said ancillary recursive neurofilter comprising a recursive neural network wherein at least one adjustable weight is a nonlinear weight in said recursive neural network's recursive section and is determined in a training of said ancillary recursive neurofilter.

9. The ancillary recursive neurofilter of claim 8 wherein said ancillary recursive neurofilter's input process comprises said primary recursive neurofilter's input and output processes.

10. The ancillary recursive neurofilter of claim 8 wherein said ancillary recursive neurofilter's input process comprises said primary recursive neurofilter's input process.

11. The ancillary recursive neurofilter of claim 8 wherein said recursive neural network is a multilayer perceptron with interconnected neurons.

12. The ancillary recursive neurofilter of claim 8 wherein said recursive neural network is a multilayer perceptron with output feedbacks.

13. The ancillary recursive neurofilter of claim 8 wherein said recursive neural network is a multilayer perceptron with interconnected neurons and tapped delay lines.

14. The ancillary recursive neurofilter of claim 8 wherein said recursive neural network is a multilayer perceptron with output feedbacks and tapped delay lines.

* * * * *